(12) United States Patent
Iwadate

(10) Patent No.: US 9,739,858 B2
(45) Date of Patent: Aug. 22, 2017

(54) MAGNETIC RESONANCE IMAGING APPARATUS WITH SEGMENTED DATA ACQUISITION

(71) Applicant: GE MEDICAL SYSTEMS GLOBAL TECHNOLOGY COMPANY, LCC., Waukesha, WI (US)

(72) Inventor: Yuji Iwadate, Hino (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 83 days.

(21) Appl. No.: 14/808,095

(22) Filed: Jul. 24, 2015

(65) Prior Publication Data
US 2016/0027169 A1    Jan. 28, 2016

(30) Foreign Application Priority Data
Jul. 24, 2014    (JP) .................... 2014-150955

(51) Int. Cl.
*G06T 7/00* (2017.01)
*G06T 5/00* (2006.01)
*G01R 33/48* (2006.01)
*G01R 33/56* (2006.01)
*G01R 33/563* (2006.01)
*G01R 33/565* (2006.01)

(52) U.S. Cl.
CPC ........ *G01R 33/482* (2013.01); *G01R 33/5601* (2013.01); *G01R 33/565* (2013.01); *G01R 33/5607* (2013.01); *G01R 33/56308* (2013.01)

(58) Field of Classification Search
CPC ....... G06T 17/00; A61B 5/055; G01R 33/482; G01R 33/5607; G01R 33/56308; G01R 33/5601
See application file for complete search history.

(56) References Cited

U.S. PATENT DOCUMENTS

| | | | | |
|---|---|---|---|---|
| 6,018,600 A * | 1/2000 | Levin | ................... | G01R 33/561 382/131 |
| 6,281,681 B1 * | 8/2001 | Cline | .................... | G01R 33/54 324/307 |
| 6,603,992 B1 * | 8/2003 | Debbins | ............. | G01R 33/5601 600/413 |
| 6,975,751 B2 * | 12/2005 | Pauly | ................. | G01R 33/4824 382/130 |
| 7,693,569 B1 * | 4/2010 | Brittain | .................. | A61B 5/055 324/307 |
| 7,853,060 B2 * | 12/2010 | Schmitt | .............. | G01R 33/4818 324/307 |

(Continued)

*Primary Examiner* — Stephen R Koziol
*Assistant Examiner* — Pinalben Patel

(57) ABSTRACT

To provide an imaging technique suitable for acquiring an image with reduced artifacts due to differences in signal intensity. An MR apparatus 100 acquires, in data acquisition periods A1, A2, and A3, data at part of grid points lying closer to a high-frequency region RH within a low-frequency region RL, and data at part of grid points lying closer to the low-frequency region RL within the high-frequency region RH. On the other hand, in a data acquisition period B, it acquires data at another part of grid points lying closer to the high-frequency region RH within the low-frequency region RL, and data at another part of grid points lying closer to the low-frequency region RL within the high-frequency region RH.

18 Claims, 26 Drawing Sheets

(56) References Cited

U.S. PATENT DOCUMENTS

| | | | | |
|---|---|---|---|---|
| 8,848,993 B2* | 9/2014 | Zenge | G01R 33/4822 382/128 |
| 2003/0011368 A1* | 1/2003 | Abe | G01R 33/563 324/309 |
| 2007/0078331 A1* | 4/2007 | Cull | G01R 33/5601 600/410 |
| 2007/0242866 A1* | 10/2007 | Schmitt | G01R 33/4818 382/130 |
| 2007/0255130 A1* | 11/2007 | Du | G01R 33/4824 600/410 |
| 2008/0021303 A1* | 1/2008 | Krueger | G01R 33/5615 600/410 |
| 2008/0021304 A1* | 1/2008 | Stemmer | G01R 33/4824 600/410 |
| 2008/0161678 A1* | 7/2008 | Miyazaki | A61B 5/0263 600/419 |
| 2009/0082656 A1* | 3/2009 | Bayram | G01R 33/4818 600/410 |
| 2009/0156927 A1* | 6/2009 | Schmidt | A61B 5/055 600/420 |
| 2010/0030062 A1* | 2/2010 | Bolar | A61B 5/055 600/419 |
| 2010/0222666 A1* | 9/2010 | Foo | A61B 5/055 600/413 |
| 2010/0260397 A1* | 10/2010 | Block | G01R 33/4824 382/131 |
| 2011/0095762 A1* | 4/2011 | Piccini | G01R 33/4824 324/312 |
| 2013/0266200 A1* | 10/2013 | Miyazaki | G01R 33/56333 382/131 |
| 2013/0317348 A1* | 11/2013 | Miyazaki | A61B 5/055 600/419 |
| 2014/0200435 A1* | 7/2014 | Edelman | A61B 5/055 600/410 |
| 2016/0061917 A1* | 3/2016 | Chase | G01R 33/4818 324/309 |

* cited by examiner

MAGNETIC RESONANCE IMAGING APPARATUS WITH SEGMENTED DATA ACQUISITION

CROSS-REFERENCE TO RELATED APPLICATIONS

This application claims the benefit of Japanese patent Application No. 2014-150955 filed Jul. 24, 2014, which is hereby incorporated by reference in its entirety.

BACKGROUND

The present invention relates to a magnetic resonance apparatus for acquiring data in k-space.

In recent years, dynamic MR imaging for acquiring images in several temporal phases using a contrast medium has become more common. Since in the dynamic contrast-enhanced MR imaging, it is important to observe a temporal change of the concentration of the contrast medium in a region to be imaged, imaging with high temporal resolution is required. Known techniques of the dynamic imaging for responding to such needs include a keyhole imaging technique in which only data in a low-frequency region around the center of k-space are updated, and a technique called DISCO in which a high-frequency region is divided into N subregions, and data in the subregions and data in a low-frequency region are alternately acquired.

SUMMARY

In the dynamic contrast-enhanced MR imaging, fat represented with high signal intensity may sometimes interfere with image diagnosis. Therefore, it is also important to apply fat suppression in the dynamic contrast-enhanced MR imaging. Thus, imaging in combination with a fat suppression technique is practiced. Some fat suppression techniques involve a method using fat suppression pulses. In case that the fat suppression pulses are used, however, significant differences in signal intensity may often appear near a border between a low-frequency region and a high-frequency region in k-space, thus posing a problem that an image suffers from artifacts due to the differences in signal intensity. Therefore, there is a need for an imaging technique suitable for obtaining images with reduced artifacts.

In one aspect is a magnetic resonance apparatus comprising scanning section for conducting a scan for acquiring data at grid points contained in a first region in k-space and data at grid points contained in a second region adjacent to said first region, wherein said scanning section acquires:

in a first data acquisition period in which acquisition of data at grid points in k-space is conducted, data at part of a first plurality of grid points lying closer to said second region within said first region, and data at part of a second plurality of grid points lying closer to said first region within said second region, and in a second data acquisition period in which acquisition of data at grid points in k-space is conducted, data at grid points of said first plurality of grid points other than those at which data are acquired in said first data acquisition period, and data at grid points of said second plurality of grid points other than those at which data are acquired in said first data acquisition period.

Data at grid points acquired in a first data acquisition period and those acquired in a second data acquisition period can be dispersed near a border between first and second regions. Since data with high signal intensity and those with low signal intensity are thus dispersedly placed near the border between the first and second regions, artifacts caused by differences in signal intensity can be reduced.

DETAILED DESCRIPTION

Now several embodiments for practicing the invention will be described hereinbelow, although the present invention is not limited thereto.

Figure 1:
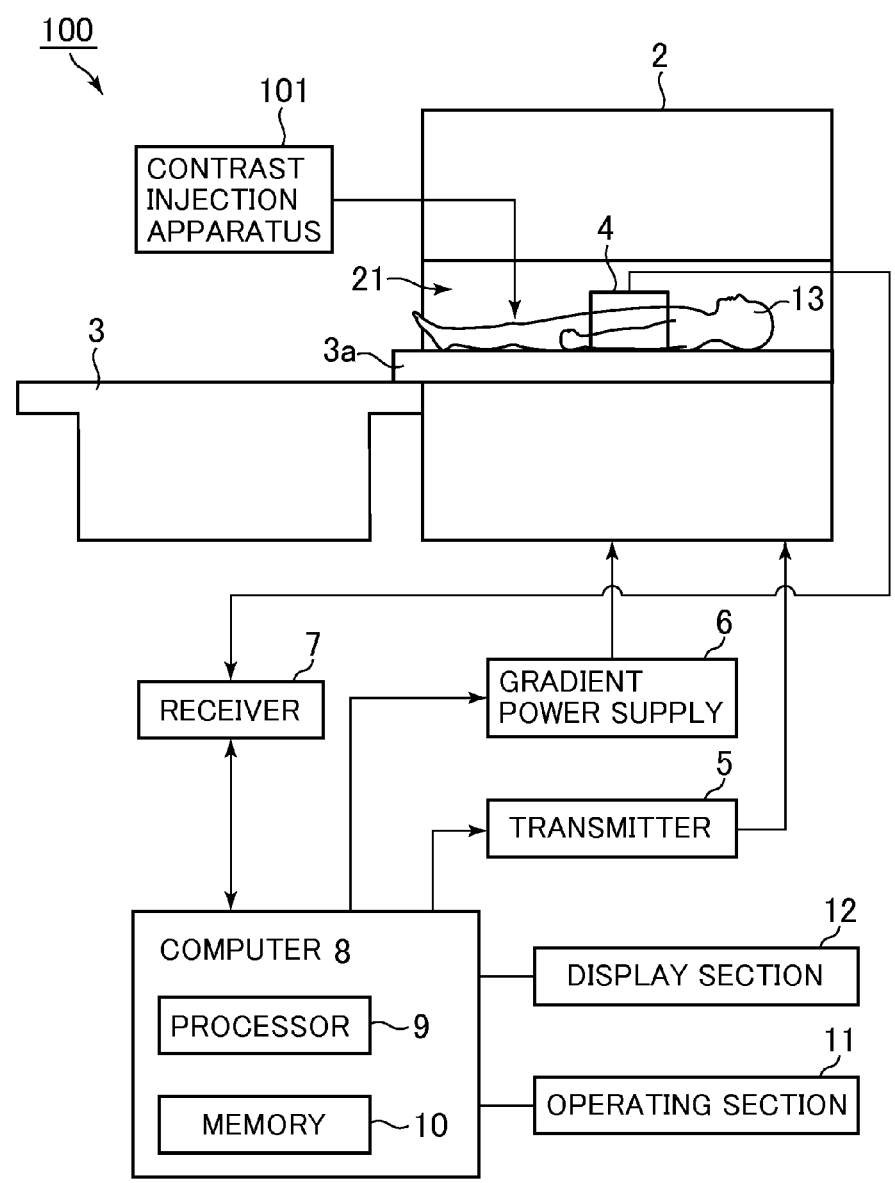
FIG. 1 is a schematic diagram of a magnetic resonance apparatus in a first embodiment.

FIG. 1 is a schematic diagram of a magnetic resonance apparatus in a first embodiment of the present invention. The magnetic resonance apparatus (referred to as "MR apparatus" hereinbelow) 100 comprises a magnet 2, a table 3, a receiving RF coil 4, and the like.

The magnet 2 has a bore 21 into which a subject 13 is inserted. In the magnet 2 are incorporated a superconductive coil, a gradient coil, an RF coil, and the like.

The table 3 has a cradle 3a for supporting the subject 13. The cradle 3a is configured to be movable into the bore 21. The subject 13 is carried into the bore 21 by the cradle 3a. The receiving RF coil (referred to as "receiving coil" hereinbelow) 4 receives magnetic resonance signals from the subject 13.

The MR apparatus 100 further comprises a transmitter 5, a gradient power supply 6, a receiver 7, a computer 8, an operating section 11, a display section 12, and the like.

The transmitter 5 supplies electric current to the RF coil, and the gradient power supply 6 supplies electric current to the gradient coil. The receiver 7 applies signal processing such as detection/demodulation to signals received from the receiving coil 4. It should be noted that the magnet 2, receiving coil 4, transmitter 5, gradient power supply 6, and receiver 7 together constitute the scanning section.

The computer 8 controls operations of several sections in the MR apparatus 100 to implement several kinds of operation of the MR apparatus 100, including an operation of transmitting required information to the display section 12, an operation of reconstructing an image, etc. The computer 8 comprises a processor 9, a memory 10, and the like.

Figure 2:
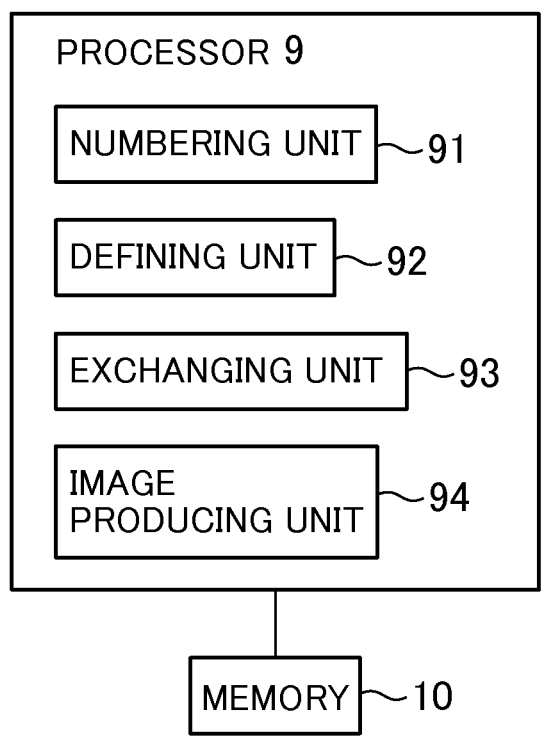
FIG. 2 is a diagram showing processing executed by a processor.

FIG. 2 is an explanatory diagram of processing the processor 9 executes. In the memory 10, programs executed by the processor 9 are stored. The processor 9 loads thereon a program stored in the memory 10, and executes processing written in the program. The processor 9 constitutes numbering unit 91-image producing unit 94, etc. by loading thereon programs stored in the memory 10.

The numbering unit 91 assigns numbers to grid points in k-space. The defining unit 92 defines a border between high- and low-frequency regions. The exchanging unit 93 exchanges numbers for part of grid points contained in the high-frequency region with those for part of grid points contained in the low-frequency region. The image producing unit 94 produces an image of a region to be imaged based on data received from the receiver 7.

The processor 9 is an example for constructing the numbering unit 91-image producing unit 94, and it functions as these unit by executing programs stored in the memory 10. It should be noted that the numbering unit 91, defining unit 92, and exchanging unit 93 together constitute the determining unit.

The operating section 11 is operated by an operator to input several kinds of information to the computer 8. The display section 12 displays several kinds of information. The MR apparatus 100 is constructed as described above.

FIG. 1 also shows a contrast medium administering apparatus 101 for administering a contrast medium to the subject. The first embodiment will address a case in which a contrast medium is administered to the subject 13 using the contrast medium administering apparatus 101 to conduct dynamic MR imaging. To clarify the effect of the dynamic MR imaging in the first embodiment, the following description will be made of keyhole imaging, which is a technique used in the dynamic MR imaging, before addressing the dynamic MR imaging in the first embodiment.

Figure 3:
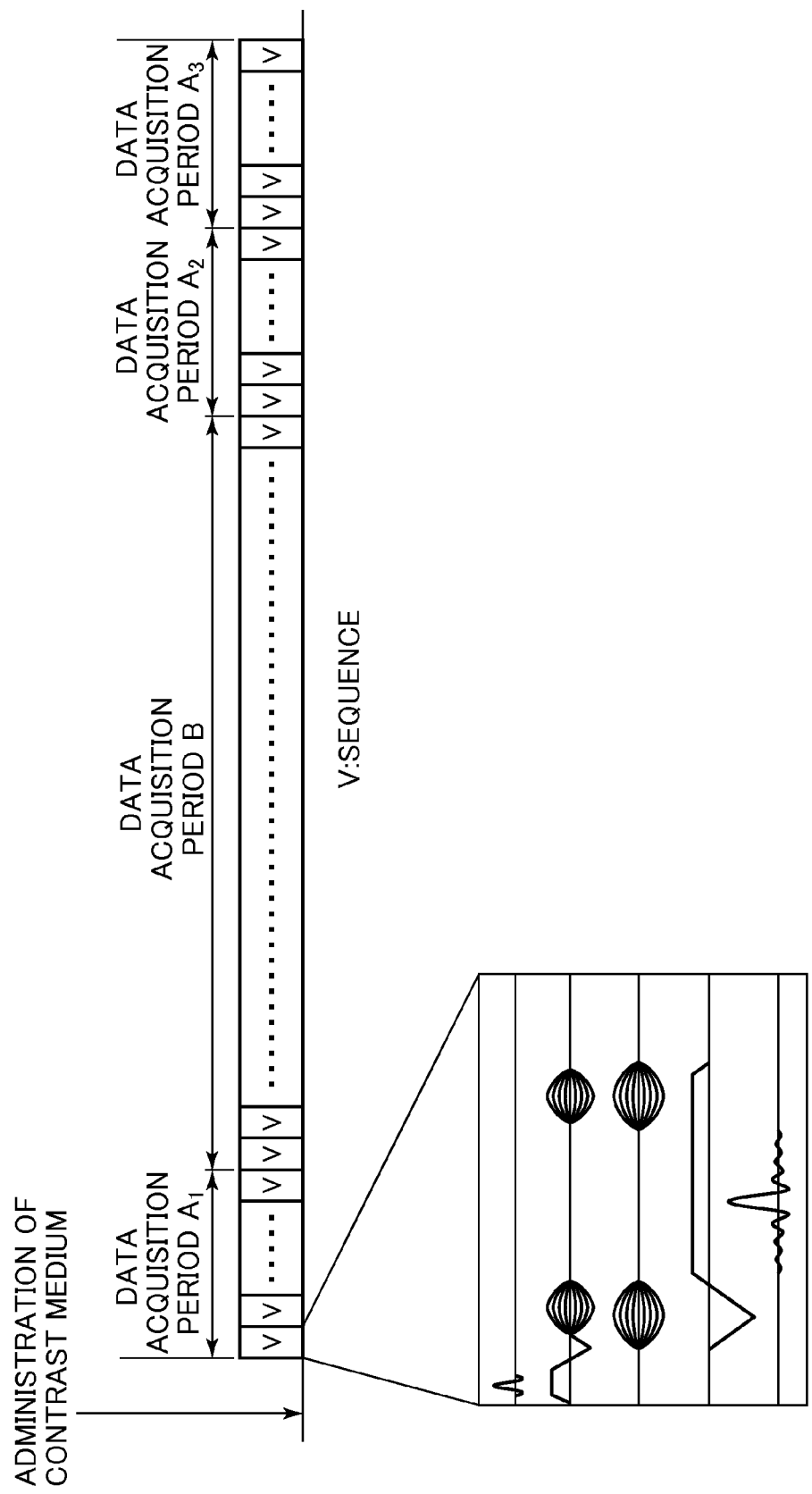
FIG. 3 is an explanatory diagram of an example of keyhole imaging.
Figure 4:
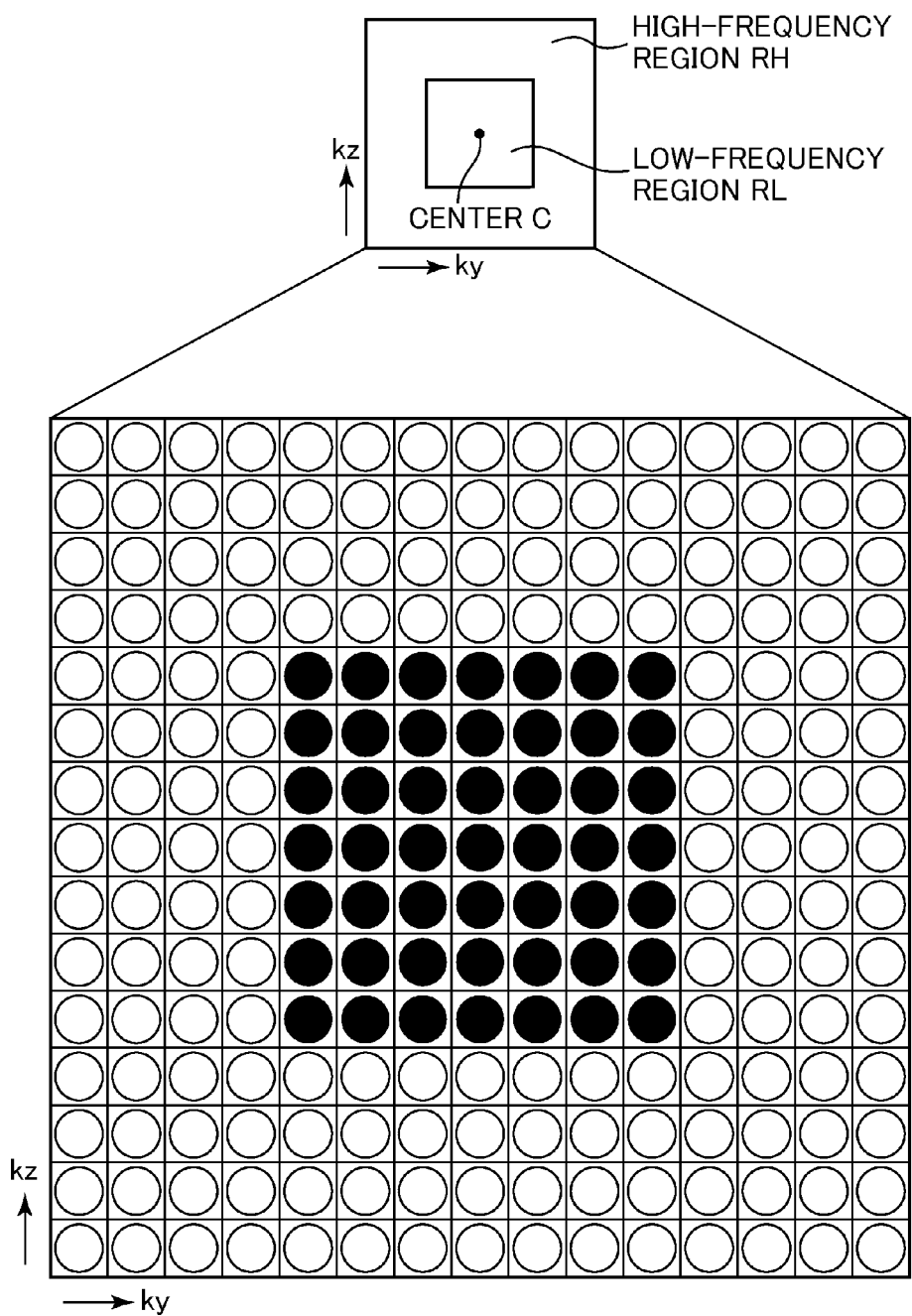
FIG. 4 is a diagram schematically showing an example in which k-space is divided into a low-frequency region and a high-frequency region.

FIG. 3 is an explanatory diagram of an example of keyhole imaging. In FIG. 3, a plurality of data acquisition periods for acquiring data in k-space are shown. In the drawing, only four data acquisition periods A1, B, A2 and A3 after administering a contrast medium are shown for convenience of explanation. In each data acquisition period, a sequence V is performed multiple times. FIG. 3 shows a 3D gradient echo-based sequence as an example of the sequence V. The keyhole imaging conducts data acquisition in k-space divided into a low-frequency region and a high-frequency region. FIG. 4 schematically shows an example in which k-space is divided into the low- and high-frequency regions. In FIG. 4, kx direction of k-space is omitted, and ky-kz plane is shown. In the keyhole imaging, ky-kz plane is divided into a low-frequency region RL and a high-frequency region RH. It is assumed that the low-frequency region RL contains 49 grid points (represented by solid circles) and the high-frequency region RH contains 176 grid points (represented by hollow circles) for convenience of explanation. In the keyhole imaging, k-space is divided into the low-frequency region RL and high-frequency region RH, as shown in FIG. 4, to conduct data acquisition separately in the data acquisition periods A1, B, A2 and A3 (see FIG. 5).

Figure 5:
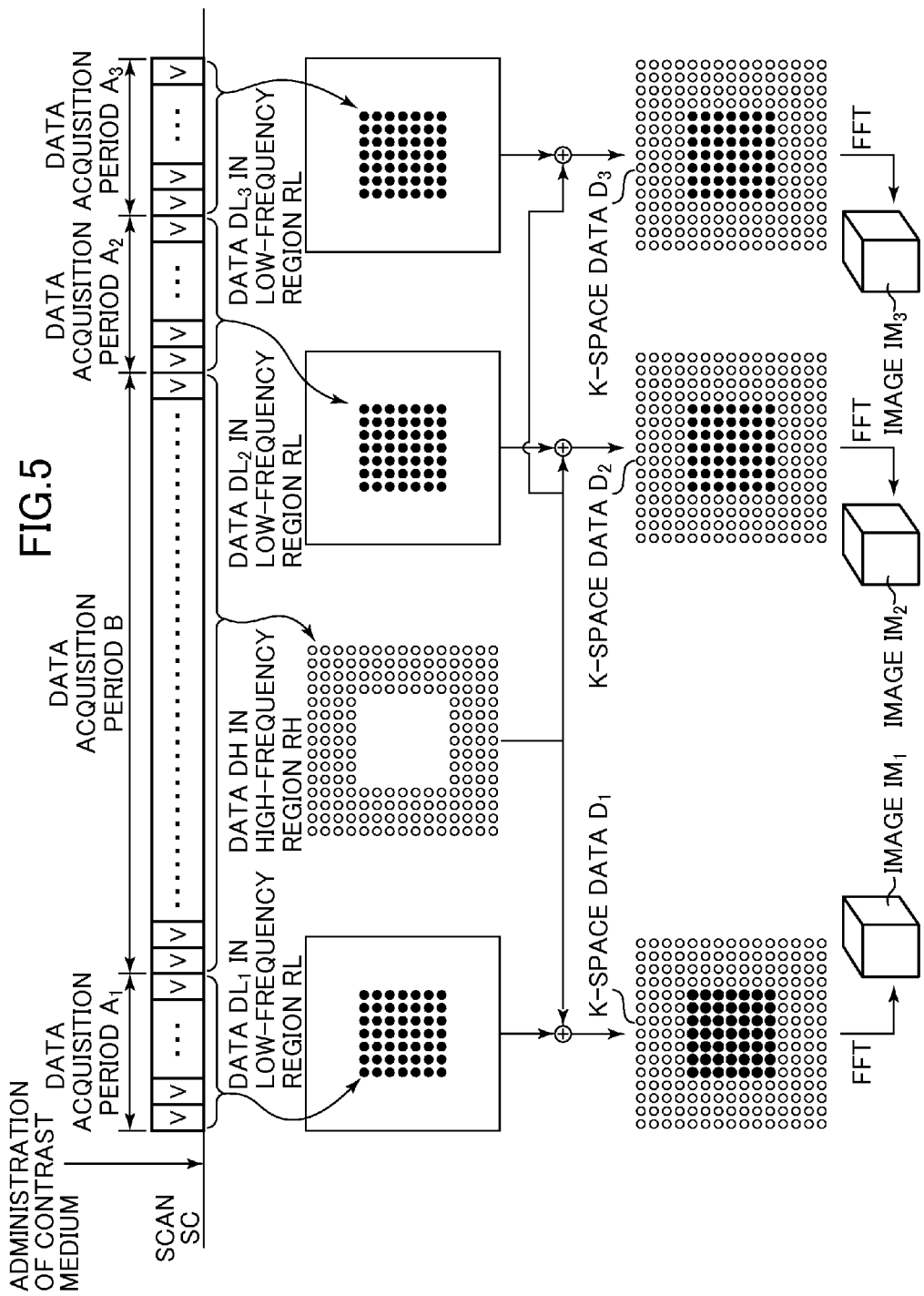
FIG. 5 is a diagram showing data in k-space acquired in data acquisition periods A1, B, A2 and A3.

FIG. 5 is a diagram showing data in k-space acquired in the data acquisition periods A1, B, A2 and A3. In the data acquisition period A1, a phase encoding gradient magnetic field in the sequence V is adjusted to acquire data at each of 49 grid points (solid circles) within the low-frequency region RL in k-space. In FIG. 5, data for the low-frequency region acquired in the data acquisition period A1 are denoted by a symbol "DL1." After acquiring the data DL1 for the low-frequency region, the process moves on to the next data acquisition period B.

In the data acquisition period B, the phase encoding gradient magnetic field in the sequence V is adjusted to acquire data at each of 176 grid points (hollow circles) within the high-frequency region RH in k-space. In FIG. 5, data for the high-frequency region acquired in the data acquisition period B are denoted by a symbol "DH." Thus, by the data DL1 obtained in the data acquisition period A1 and the data DH obtained in the data acquisition period B, k-space data D1 including data at all grid points can be obtained. After the k-space data D1 have been obtained, Fourier transform may be applied to thereby produce an image $IM_1$. After the data acquisition period B has ended, the process moves on to the next data acquisition period A2.

In the data acquisition period A2, similarly to the data acquisition period A1, the phase encoding gradient magnetic field in the sequence V is adjusted to acquire data at each of 49 grid points (solid circles) within the low-frequency region RL in k-space. In FIG. 5, data for the low-frequency region RL acquired in the data acquisition period A2 are denoted by a symbol "DL2." By the data DH obtained in the data acquisition period B and the data DL2 obtained in the data acquisition period A2, a second set of k-space data D2 can be obtained. After the k-space data D2 have been obtained, Fourier transform may be applied to thereby produce an image $IM_2$. After the data acquisition period A2 has ended, the process moves on to the next data acquisition period A3.

In the data acquisition period A3, similarly to the data acquisition period A1, the phase encoding gradient magnetic field in the sequence V is adjusted to acquire data at each of 49 grid points (solid circles) within the low-frequency region RL in k-space. In FIG. 5, data for the low-frequency region RL acquired in the data acquisition period A3 are denoted by a symbol "DL3." By the data DH obtained in the data acquisition period B and the data DL3 obtained in the data acquisition period A3, a third set of k-space data D3 can be obtained. After the k-space data D3 have been obtained, Fourier transform may be applied to thereby produce an image $IM_3$.

In the keyhole imaging, the data DH for the high-frequency region RH in k-space acquired in the data acquisition period B are used in common as data for the high-frequency region in k-space used for producing the images $IM_1$, $IM_2$, and $IM_3$. Therefore, since only data for the low-frequency region RL may be acquired in the data acquisition periods A1, A2, and A3, the images $IM_1$, $IM_2$, and $IM_3$ can be obtained at short time intervals, thus improving temporal resolution of the dynamic contrast-enhanced MR imaging.

In the dynamic contrast-enhanced MR imaging, however, fat represented with high signal intensity may sometimes interfere with image diagnosis. Therefore, it is also important to apply fat suppression in the dynamic contrast-enhanced MR imaging. Now consider a case in which a fat suppression technique is applied to the scan SC shown in FIG. 5 (see FIG. 6).

Figure 6:
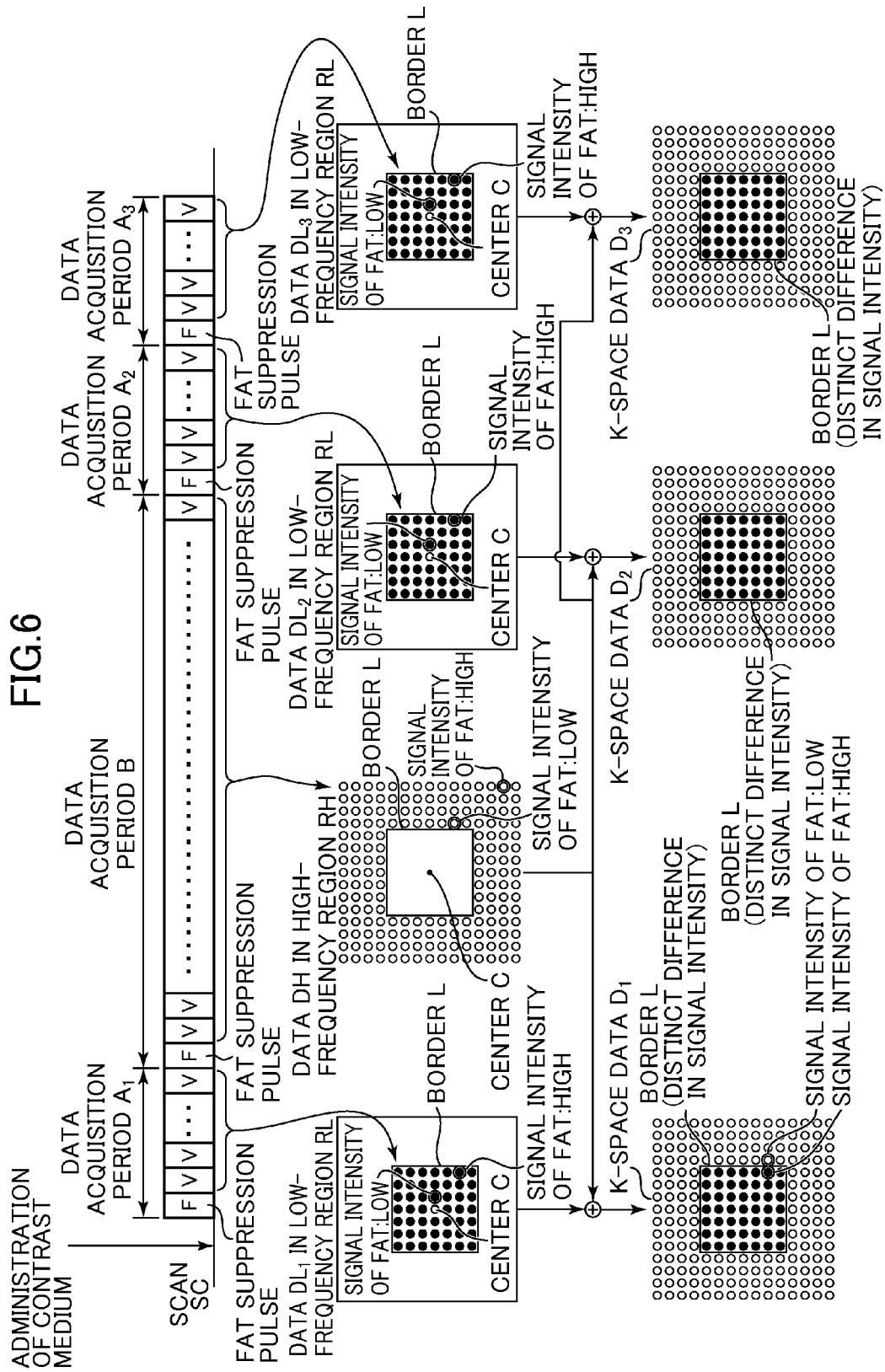
FIG. 6 is an explanatory diagram of a case in which a fat suppression technique is applied.

FIG. 6 is an explanatory diagram of a case in which a fat suppression technique is applied. FIG. 6 shows a case in which a fat suppression pulse F is used to apply fat suppression. A fat suppression effect of the fat suppression pulse F will be described hereinbelow. In the data acquisition period A1, a fat suppression pulse F is first applied. After the fat suppression pulse F is applied, a sequence V is performed to acquire data DL1 for the low-frequency region RL. Generally, in case that fat suppression is applied, once a fat suppression pulse F has been applied, data are acquired starting with a grid point closer to the center C of k-space to enhance the fat suppression effect. Therefore, in the data acquisition period A1, data at a grid point at the center C of the low-frequency region is acquired immediately after the fat suppression pulse F is applied. Then, data are acquired sequentially from a grid point closer to the center C, and as the end point of time of the data acquisition period A1 is approached, data at a grid point lying in the closer vicinity of the border L between the low- and high-frequency regions is acquired. Therefore, the signal intensity of fat is low (fat is fully suppressed) in the vicinity of the center C of k-space because the fat suppression effect of the fat suppression pulse F is higher there, while the signal intensity of fat is higher in the vicinity of the border L as compared with the vicinity of the center C of k-space because the fat suppression effect of the fat suppression pulse F diminishes there. After acquiring the data for the low-frequency region RL, the process moves on to the next data acquisition period B.

In the data acquisition period B, similarly to the data acquisition period A1, a fat suppression pulse F is first applied. After the fat suppression pulse F is applied, a sequence V is performed to acquire data DH for the high-frequency region RH. To enhance the fat suppression effect of the fat suppression pulse F also in the data acquisition period B, data are acquired starting with a grid point closer to the low-frequency region (that is, a grid point lying in the vicinity of the border L). Then, as the end point of time of the data acquisition period B is approached, data at a grid point at a position farther from the border L is acquired. Therefore, the signal intensity of fat is low (fat is fully suppressed) in the vicinity of the border L because the fat suppression effect of the fat suppression pulse F is higher there, while the signal intensity of fat is higher as the distance from the border L increases because the fat suppression effect of the fat suppression pulse F diminishes there.

The data DL1 for the low-frequency region are acquired in the data acquisition period A1 and the data DH for the high-frequency region are acquired in the data acquisition period B, and thus, k-space data D1 including data at all grid points can be obtained. However, since the data DL1 for the low-frequency region have high signal intensity of fat in the vicinity of the border L whereas the data DH for the high-frequency region have low signal intensity of fat in the vicinity of the border L, a distinct difference in which signal intensity steeply changes is formed in the border L in the k-space data D1. Once such a distinct difference in signal intensity is formed in k-space, ghosts appear in the image $IM_1$, posing a problem that image quality is degraded.

After the data in the high-frequency region RH have been acquired, data acquisition is conducted in the data acquisition periods A2 and A3. Again in the data acquisition periods A2 and A3, a fat suppression pulse F is applied and a sequence V is performed. Therefore, in the k-space data D2 and D3, similarly to the k-space data D1, a distinct difference in signal intensity is formed in the border L. Thus, ghosts appear also in the images $IM_2$ and $IM_3$, posing a problem that image quality is degraded.

Accordingly, in the first embodiment, dynamic MR imaging is conducted so that ghosts are reduced even in a scan using a fat suppression pulse F. Now the dynamic MR imaging in the first embodiment will be described hereinbelow.

Figure 7:
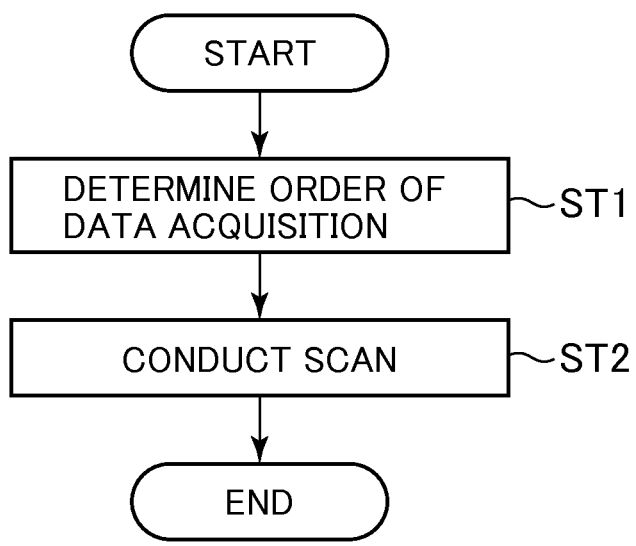
FIG. 7 is a diagram showing flow representing dynamic MR imaging in the first embodiment.

FIG. 7 is a diagram showing flow of the dynamic MR imaging according to the first embodiment. The flow in the first embodiment may be divided into two steps ST1 and ST2. Step ST1 is a step of determining the order of acquisition of data at grid points in k-space. Step ST2 is a step of conducting a scan based on the order of data acquisition determined at Step ST1. Now Steps ST1 and ST2 will be described one by one.

Figure 8:
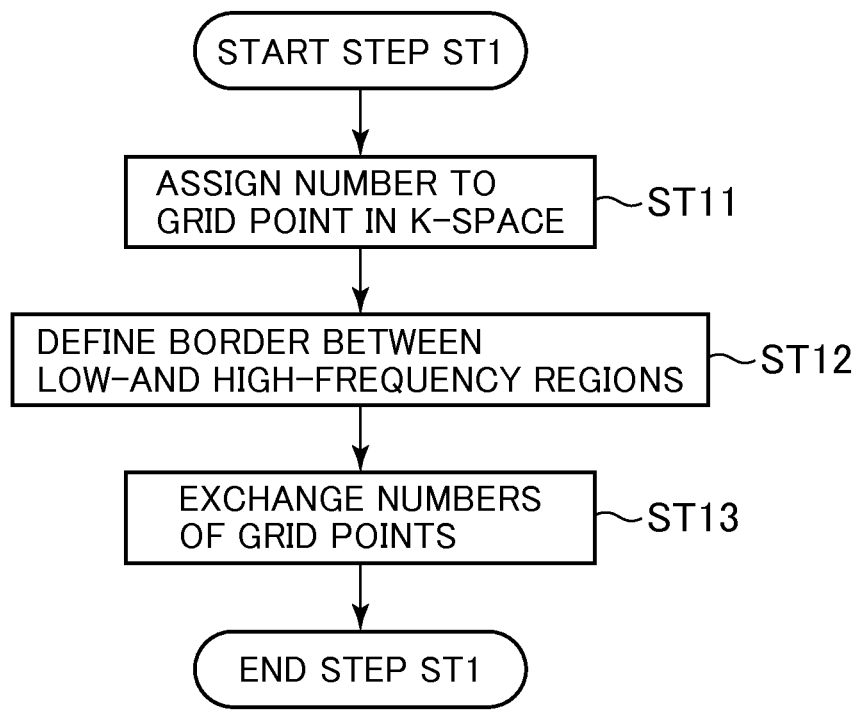
FIG. 8 is an explanatory diagram of Step ST1.

FIG. 8 is an explanatory diagram of Step ST1. Step ST1 has Steps ST11-ST13. Now Steps ST11-ST13 will be described one by one.

Figure 9:
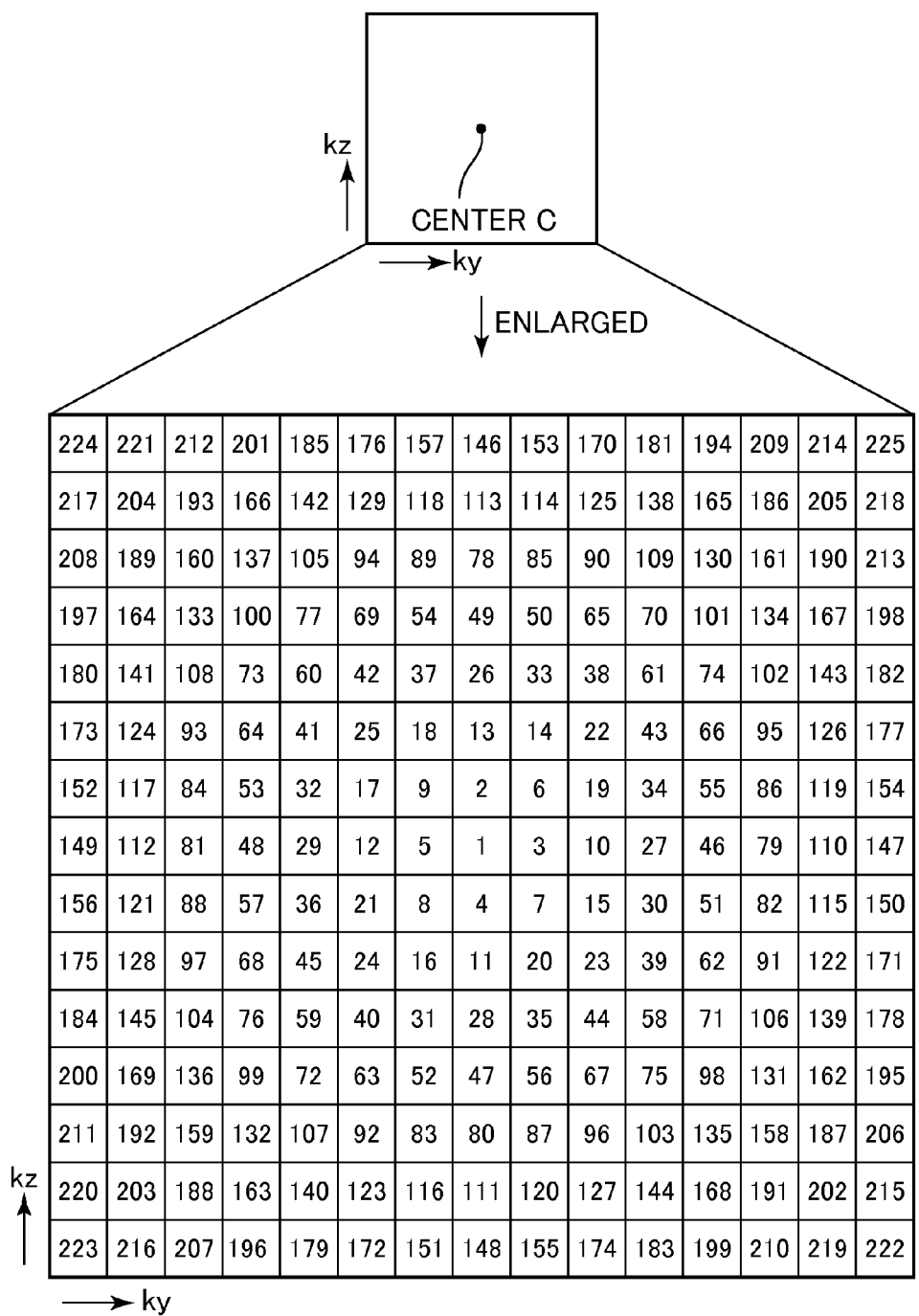
FIG. 9 is a diagram showing numbers assigned to grid points.

At Step ST11, the numbering unit 91 (see FIG. 2) assigns numbers 1-n to grid points in k-space in an ascending order of the distance from the center C of k-space. FIG. 9 shows numbers assigned to grid points. In the first embodiment, it is assumed that the number of grid points in k-space is 225 for convenience of explanation. Therefore, the grid points in k-space are assigned with numbers 1-225 in an ascending order of the distance from the center C of k-space.

In FIG. 9, one grid point is represented by one box. A number put in a box represents a number assigned to each grid point. Number "1" is assigned to a grid point at the center C of k-space. Then, a distance d between each grid point in k-space and the grid point (number "1") at the center C of k-space is calculated, and numbers "2," "3," "4," . . . , "225" are assigned in an ascending order of the distance d. Therefore, a shorter distance d (a grid point closer to the center C of k-space) causes a smaller number to be assigned to the grid point, while a longer distance d (a grid point farther from the center C) causes a greater number to be assigned to the grid point. In the following description, each grid point will be referred to by the number assigned thereto (for example, a grid point assigned with number "1" will be referred to as "grid point 1" hereinbelow) for convenience of explanation. It should be noted that there are some grid points (for example, grid points 2, 3, 4, and 5) having the same value of the distance d within k-space. In such a case, the number is assigned based on a specified condition (for example, a difference in coordinate value of kz and/or ky coordinates). Thus, 225 grid points can be assigned with distinct numbers. After the number is assigned to every grid point, the process goes to Step ST12.

Figure 10:
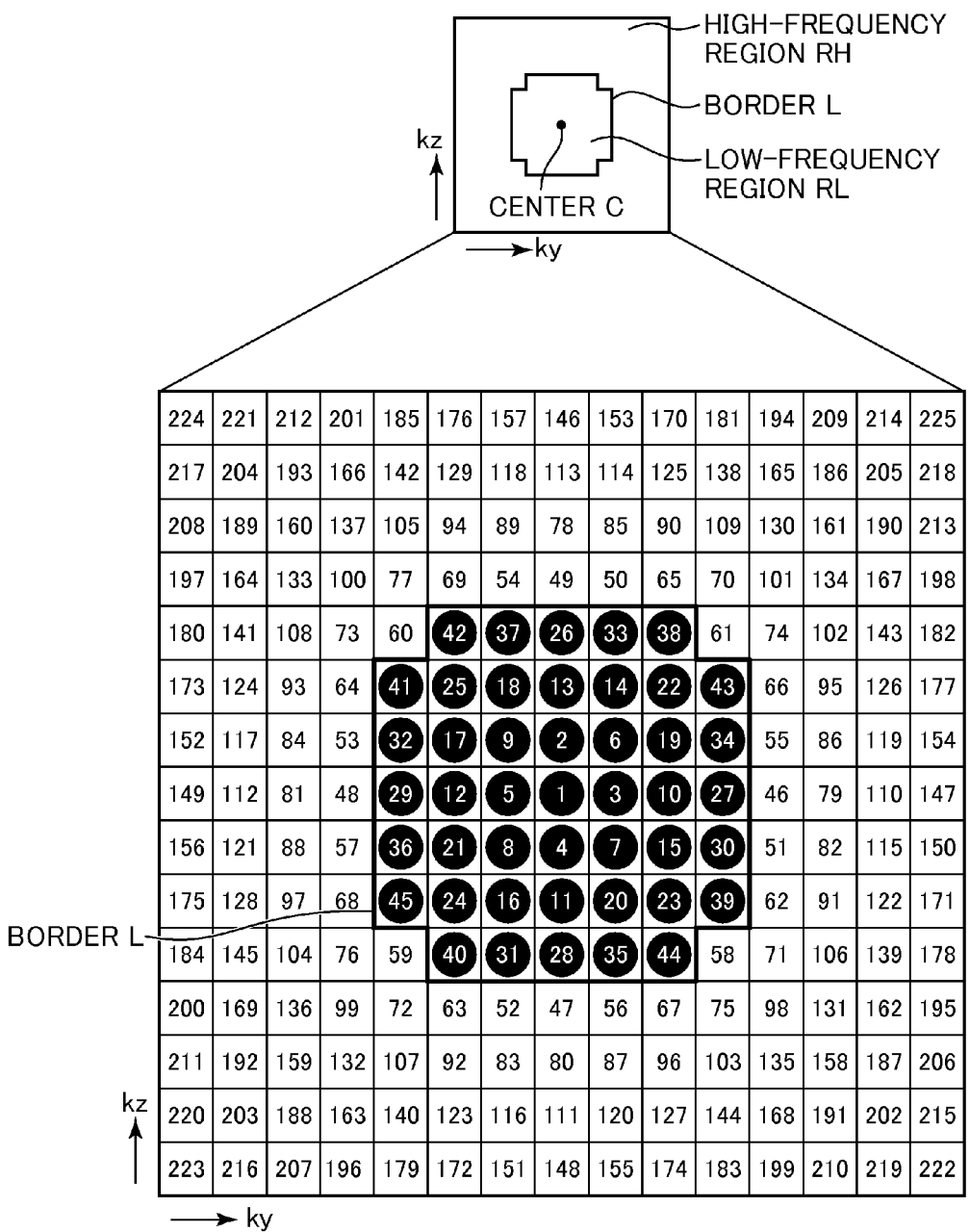
FIG. 10 is a diagram showing an example of a border L between low- and high-frequency regions.

At Step ST12, the defining unit 92 (see FIG. 2) defines a border between low- and high-frequency regions in k-space. FIG. 10 shows an example of a border L between low- and high-frequency regions. The border L is defined to surround 45 grid points 1-45, so that grid points 46-225 lie outside of the border L. In FIG. 10, to make a distinction between grid points inside of the border L and those outside of the border L, grid points inside of the border L are represented with solid circles. After the border L is defined, the process goes to Step ST13.

At Step ST13, the exchanging unit 93 (see FIG. 2) exchanges numbers for part of 45 grid points 1-45 lying in the region inside of the border L (in the low-frequency region RL) with those for grid points lying in the region outside of the border L (in the high-frequency region RH). Now a method of exchanging will be described hereinbelow.

In the first embodiment, the exchanging unit 93 first identifies grid point Np from within the region inside of the border L (within the low-frequency region RL) that is assigned with number Np defined by the following equation:

$$Np = 45 - \alpha(n-1) \quad (1)$$

where $\alpha$: a coefficient, and
n: an integer in a range of $1 \leq n \leq n_u$.

Next, the exchanging unit 93 identifies grid point Nq from within the region outside of the border L (within the high-frequency region RH) that is assigned with number Nq defined by the following equation:

$$Nq = 45 + \beta \cdot n \quad (2)$$

where $\beta$: a coefficient, and
n: an integer in a range of $1 \leq n \leq n_u$.

It should be noted that $n_u$ that defines an upper limit of n is set to satisfy the following expressions:

$$45 - \alpha(n_u - 1) \geq 1 \quad (3)$$

$$45 + \beta \cdot n_u \leq 225 \quad (4)$$

The exchanging unit 93 conducts an exchange between the number for grid point Np determined by EQ. (1) and that for grid point Nq determined by EQ. (2). It is assumed hereinbelow that in EQS. (1) and (2), $\alpha = \beta = 2$, and $n_u = 16$ for convenience of explanation. Therefore, Np in EQ. (1) and Nq in EQ. (2) are represented by the following equation:

$$Np = 45 - 2(n-1) \quad (5)$$

where n: an integer in a range of $1 \leq n \leq 16$,
and $$Nq = 45 + 2 \cdot n \quad (6)$$

where n: an integer in a range of $1 \leq n \leq 16$.

The exchanging unit 93 substitutes n=1, 2, 3, ..., 16 for n in EQS. (5) and (6) to achieve an exchange between the numbers for grid points Np and Nq. In particular, the numbers for grid points are exchanged with each other according to the procedure below.

Figure 11:
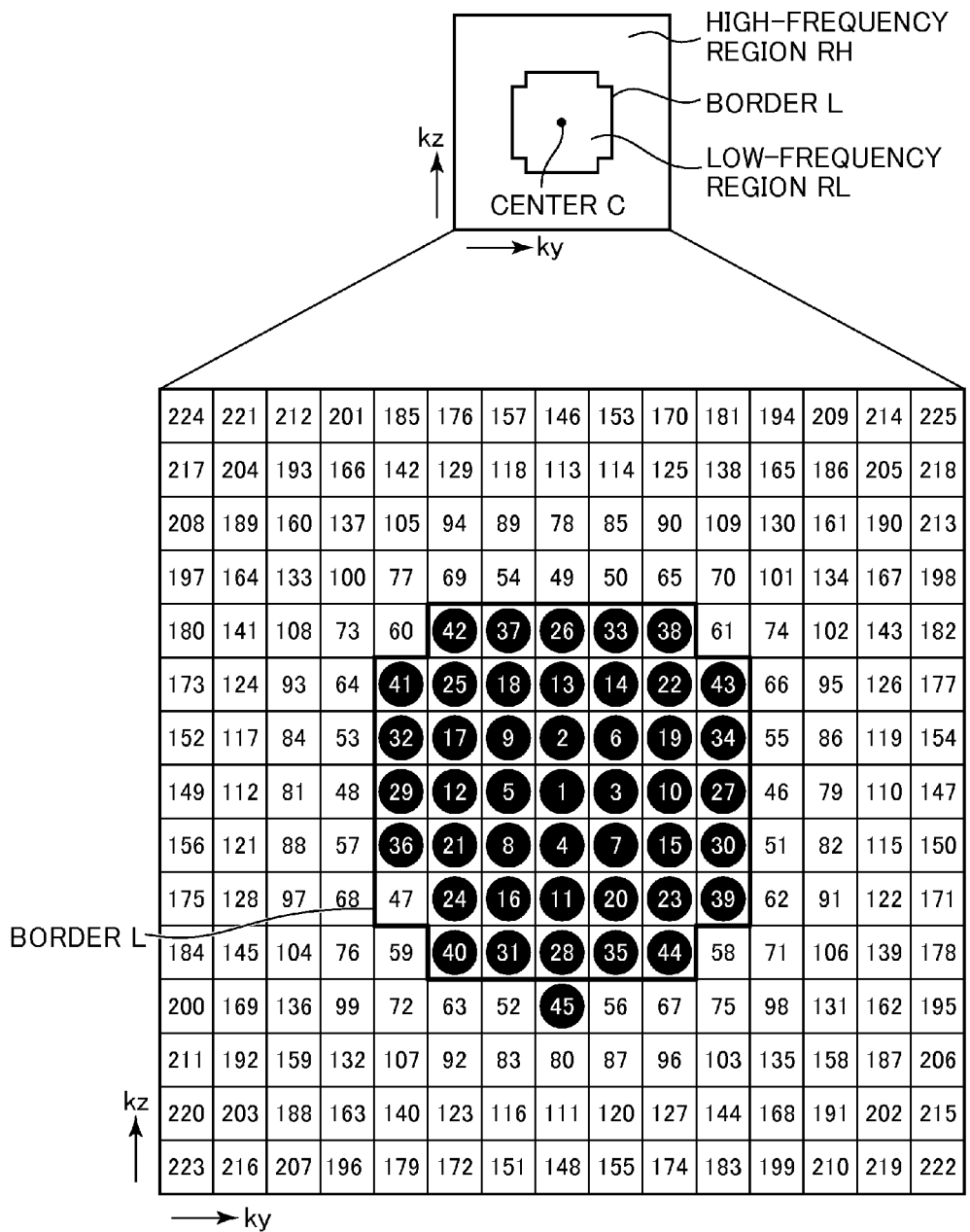
FIG. 11 is a diagram schematically showing k-space after numbers are exchanged.

The exchanging unit 93 first substitutes n=1 for n in EQS. (5) and (6). For n=1, Np=45 and Nq=47. Therefore, for n=1, number "45" for grid point 45 and number "47" for grid point 47 are chosen. The exchanging unit 93 exchanges number "45" for the chosen grid point 45 with number "47" for the chosen grid point 47. FIG. 11 schematically shows k-space after the numbers have been exchanged. By the exchange, grid point 45 is placed in the region outside of the border L (in the high-frequency region RH), while grid point 47 is placed in the region inside of the border L (in the low-frequency region RL).

Figure 12:
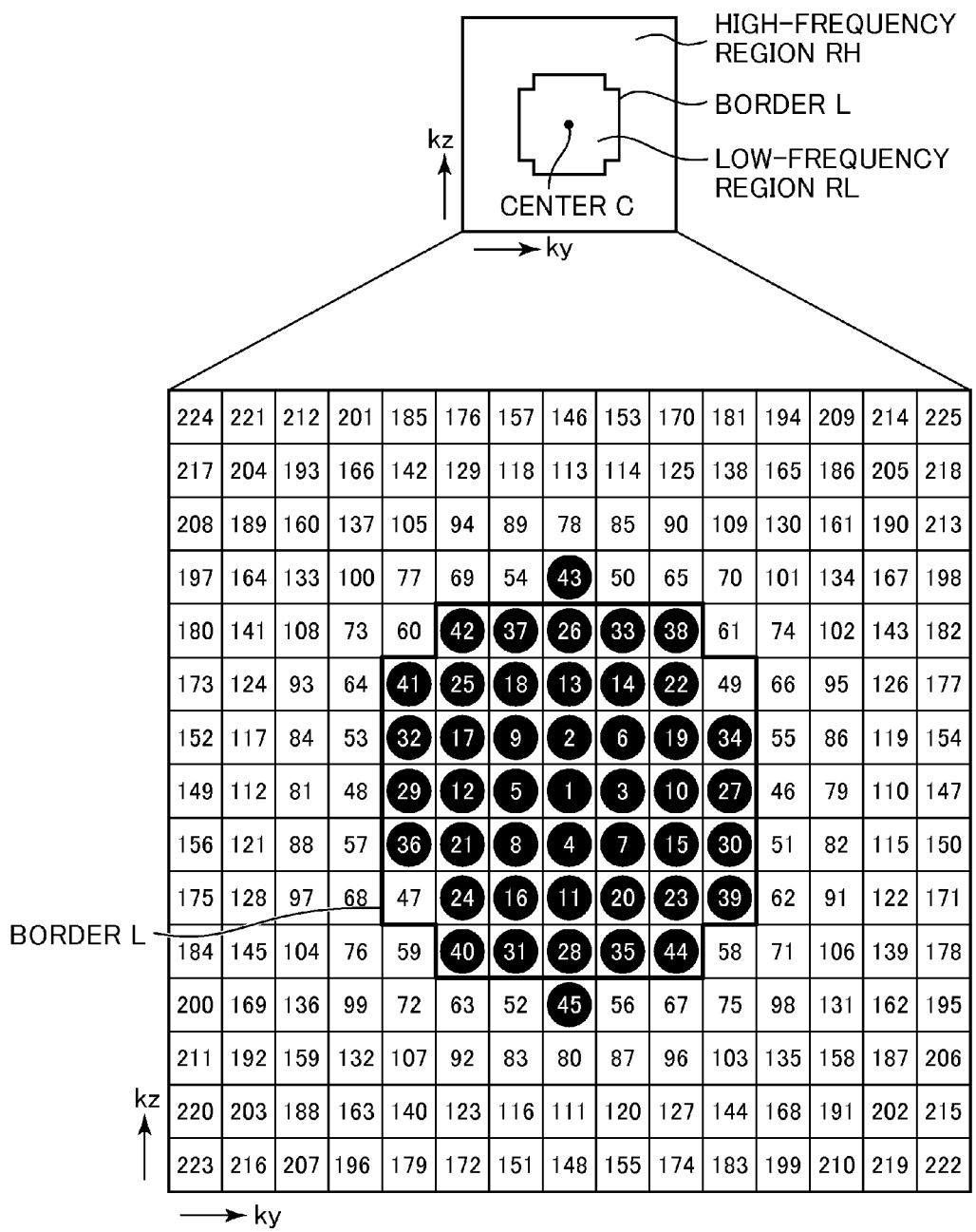
FIG. 12 is a diagram schematically showing k-space after numbers are exchanged.

Next, the exchanging unit 93 substitutes n=2 for n in EQS. (5) and (6). For n=2, Np=43 and Nq=49. Therefore, for n=2, number "43" for grid point 43 and number "49" for grid point 49 are chosen. The exchanging unit 93 exchanges number "43" for the chosen grid point 43 with number "49" for the chosen grid point 49. FIG. 12 schematically shows k-space after the numbers have been exchanged. By the exchange, grid point 43 is placed in the region outside of the border L (in the high-frequency region RH), while grid point 49 is placed in the region inside of the border L (in the low-frequency region RL).

Figure 13:
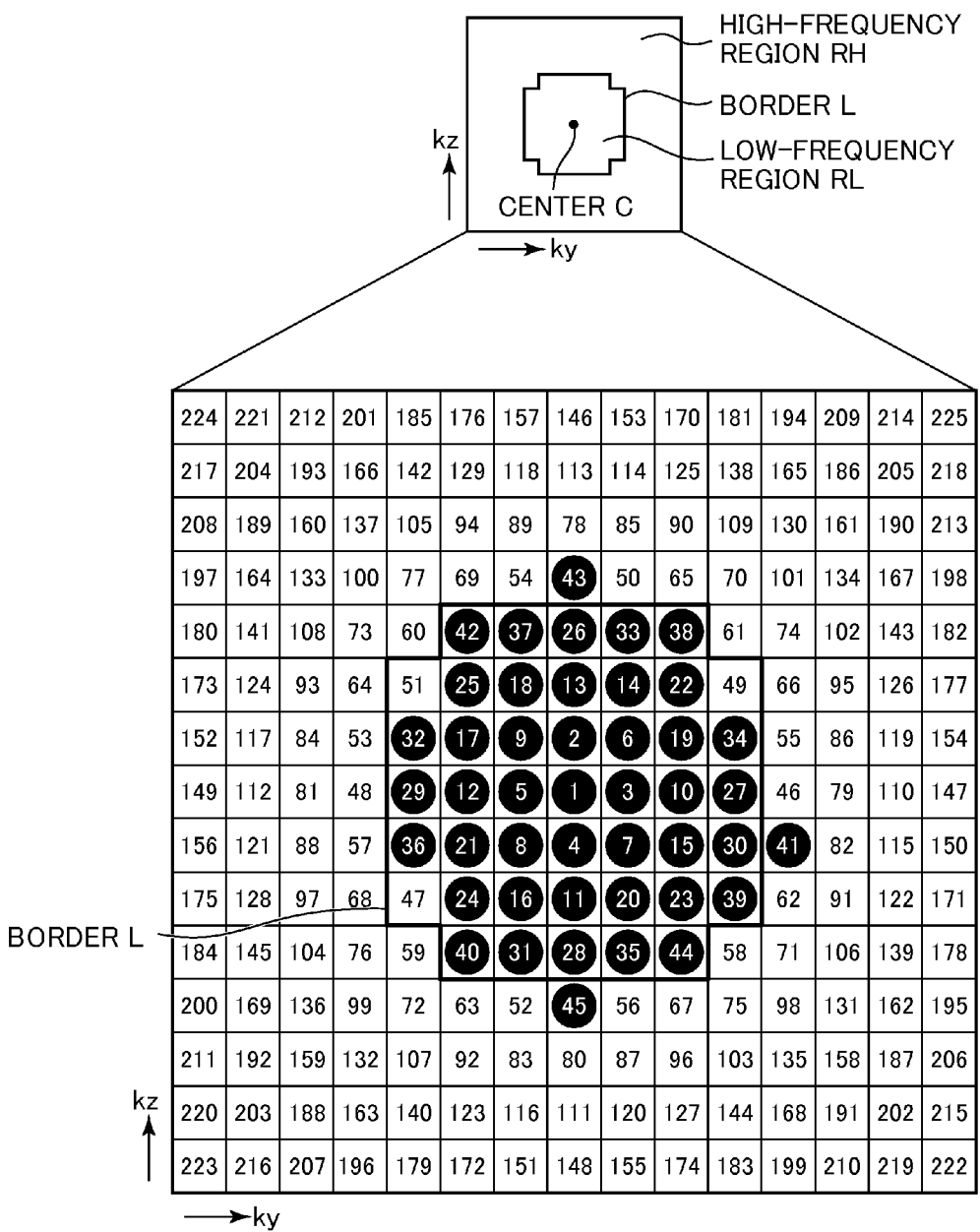
FIG. 13 is a diagram schematically showing k-space after numbers are exchanged.

Next, the exchanging unit 93 substitutes n=3 for n in EQS. (5) and (6). For n=3, Np=41 and Nq=51. Therefore, for n=3, number "41" for grid point 41 and number "51" for grid point 51 are chosen. The exchanging unit 93 exchanges number "41" for the chosen grid point 41 with number "51" for the chosen grid point 51. FIG. 13 schematically shows k-space after the numbers have been exchanged. By the exchange, grid point 41 is placed in the region outside of the border L (in the high-frequency region RH), while grid point 51 is placed in the region inside of the border L (in the low-frequency region RL).

Figure 14:
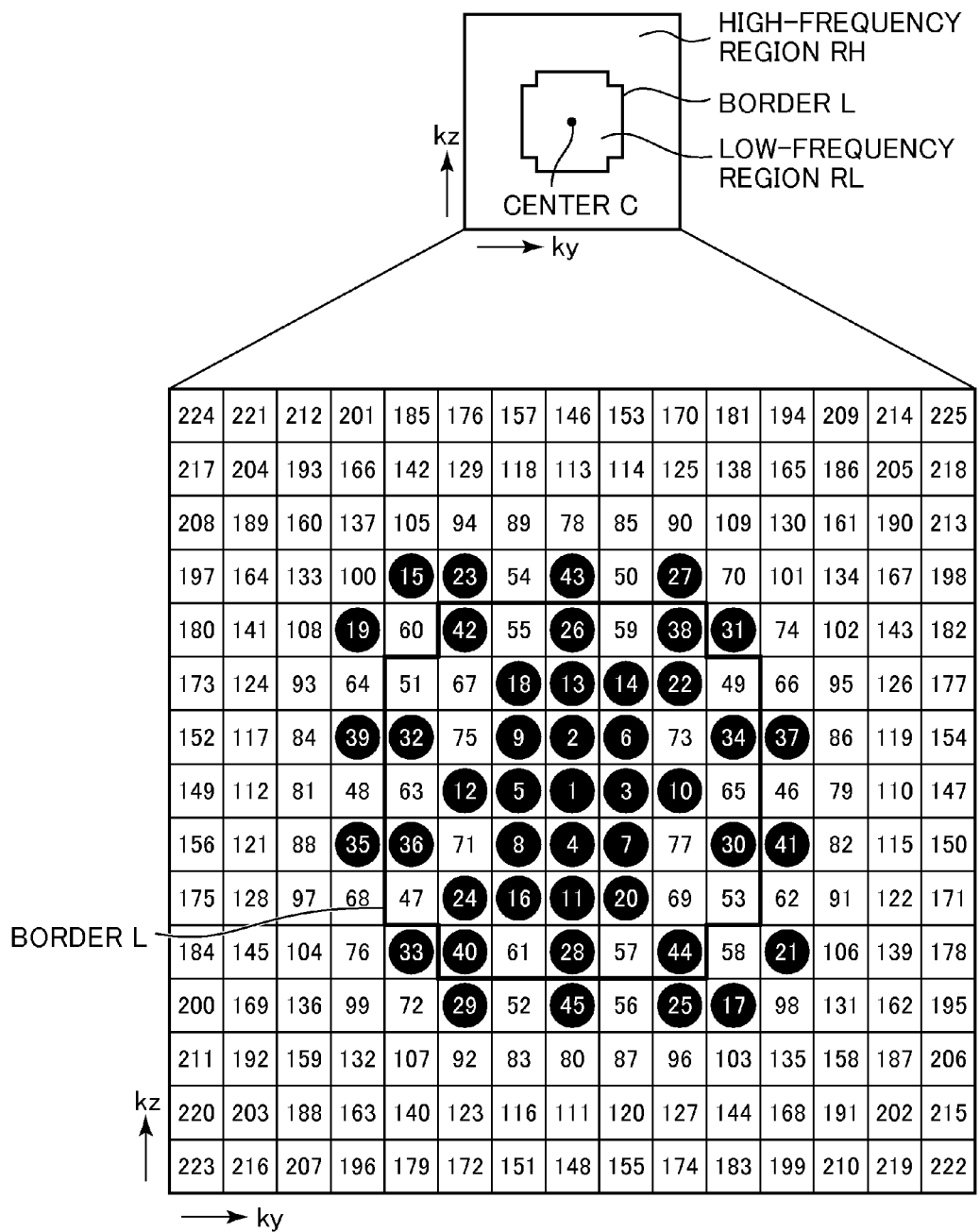
FIG. 14 is a diagram schematically showing a condition in which numbers for grid points are exchanged in a range of $1 \leq n \leq 16$.

Thereafter, in a similar manner, the exchanging unit 93 increments the value of n until the value of n=16 is reached. For n=16, Np=15 and Nq=77. Therefore, the exchanging unit 93 exchanges number "15" for grid point 15 with number "77" for grid point 77. In this way, the numbers for grid points Np and Nq are exchanged with each other. FIG. 14 schematically shows a condition in which the numbers for grid points are exchanged in a range of $1 \leq n \leq 16$.

Thus, at Step ST13, numbers assigned to grid points lying closer to the border L among a plurality of grid points contained in the low-frequency region RL are exchanged with those assigned to grid points lying closer to the border L among a plurality of grid points contained in the high-frequency region RH. Therefore, grid points whose numbers are not exchanged (for example, grid point 1) among grid points 1-45 are left in the low-frequency region RL, while grid points whose numbers are exchanged (for example, grid point 15) among grid points 1-45 are placed on the high-frequency region RH side across the border L. Similarly, grid points whose number are not exchanged (for example, grid point 225) among grid points 46-225 are left in the high-frequency region RL, while grid points whose numbers are exchanged (for example, grid point 47) among grid points 46-225 are placed on the low-frequency region RL side across the border L.

According to the first embodiment, numbers "1"-"225" assigned to the grid points shown in FIG. 14 represent the order in which data at the grid points are to be acquired. In this way, the order of acquisition of data at the grid points may be determined. Moreover, in FIG. 14, grid points 1-45 represent grid points undergoing data acquisition in the data acquisition periods A1, A2, and A3 (see FIG. 15) of a scan conducted at Step ST2, which will be discussed later, while grid points 46-225 represent grid points undergoing data acquisition in the data acquisition period B (see FIG. 15) of the scan conducted at Step ST2, which will be discussed later. Therefore, by executing Step ST1, grid points 1-45 undergoing data acquisition in the data acquisition periods A1, A2, and A3 (see FIG. 15) and grid points 46-225 undergoing data acquisition in the data acquisition period B (see FIG. 15) may be determined from among a plurality of grid points contained in k-space. Once grid points 1-225 shown in FIG. 14 have been determined, the flow at Step ST1 is terminated. After Step ST1 has ended, the process goes to Step ST2 (see FIG. 7).

At Step ST2, a scan for acquiring data at grid points 1-255 is conducted.

Figure 15:
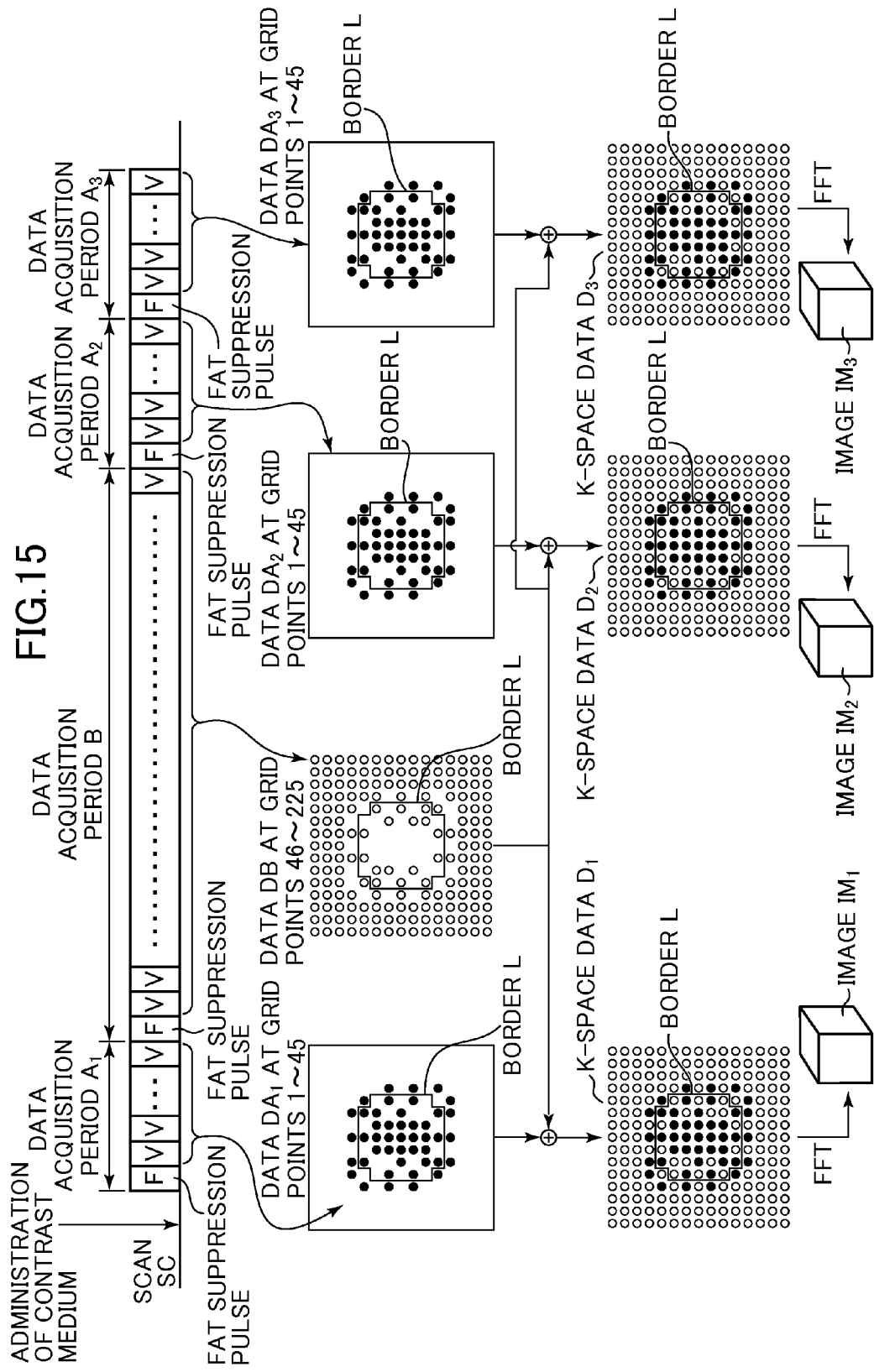
FIG. 15 is an explanatory diagram of a scan SC conducted at Step ST2.

FIG. 15 is an explanatory diagram of the scan SC conducted at Step ST2. In the scan SC, first, a fat suppression pulse F is applied in the data acquisition period A1. Immediately after the fat suppression pulse F is applied, a sequence V is performed. In the data acquisition period A1, data DA1 at grid points 1-45 are acquired in the order of the numbers assigned to the grid points. In FIG. 15, the data at grid points 1-45 acquired in the data acquisition period A1 are represented by "•" (solid circles) due to constraints in illustration. After acquiring the data at grid points 1-45, the process moves on to the next data acquisition period B.

In the data acquisition period B, similarly to the data acquisition period A1, a fat suppression pulse F is applied. Immediately after the fat suppression pulse F is applied, a sequence V is performed. In the data acquisition period B, data at grid points 46-225 are acquired in the order of the numbers assigned to the grid points. In FIG. 15, the data at grid points 46-225 acquired in the data acquisition period B are represented by "○" (hollow circles) due to constraints in illustration.

By the data DA1 obtained in the data acquisition period A1 and the data DB obtained in the data acquisition period B, k-space data D1 including the data at grid points 1-225 can be obtained.

Figure 16:
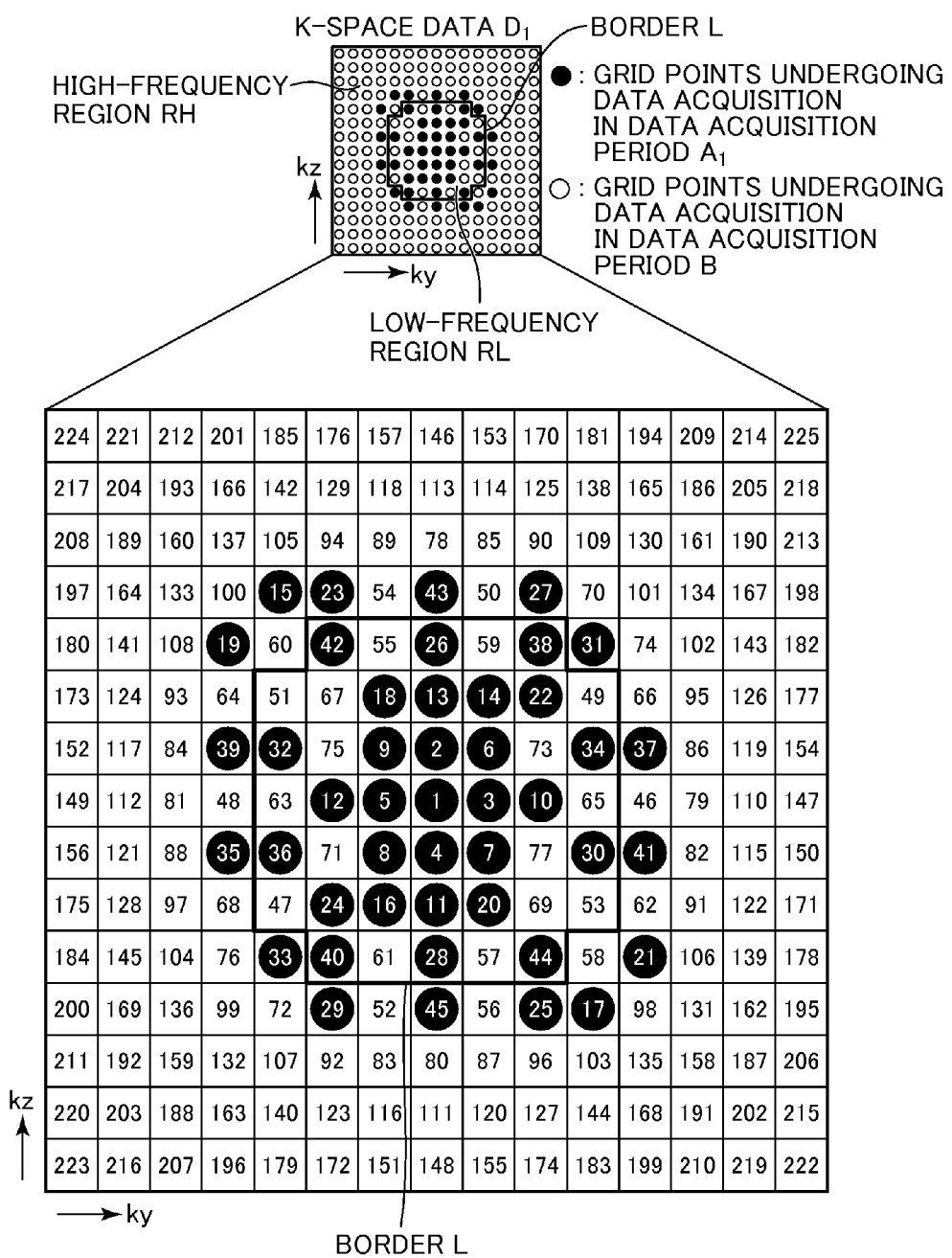
FIG. 16 is an enlarged view of k-space data D1.

FIG. 16 is an enlarged view of the k-space data D1. In the data acquisition period A1, data at the grid points as below are acquired:

(a1) data at grid point 1 at the center of k-space, and data at neighboring grid points (for example, grid point 6) of grid point 1;

(a2) data at part of the plurality of grid points (for example, grid points 32, 36) lying closer to the high-frequency region RH within the low-frequency region RL; and (a3) data at part of the plurality of grid points (for example, grid points 35, 39) lying closer to the low-frequency region RL within the high-frequency region RH.

On the other hand, in the data acquisition period B, data at the following grid points are acquired:

(b1) data at grid points (for example, grid point 225) near the outer periphery of the high-frequency region RH;

(b2) data at part of the plurality of grid points (for example, grid points 48, 64) lying closer to the low-frequency region RL within the high-frequency region RH; and (b3) data at part of the plurality of grid points (for example, grid points 51, 63) lying closer to the high-frequency region RH within the low-frequency region RL.

Thus, in the data acquisition period A1, in addition to data at grid points in the low-frequency region RL, data at grid points in the high-frequency region RH are acquired. Similarly, in the data acquisition period B, in addition to data at grid points in the high-frequency region RH, data at grid points in the low-frequency region RL are acquired.

Figure 17:
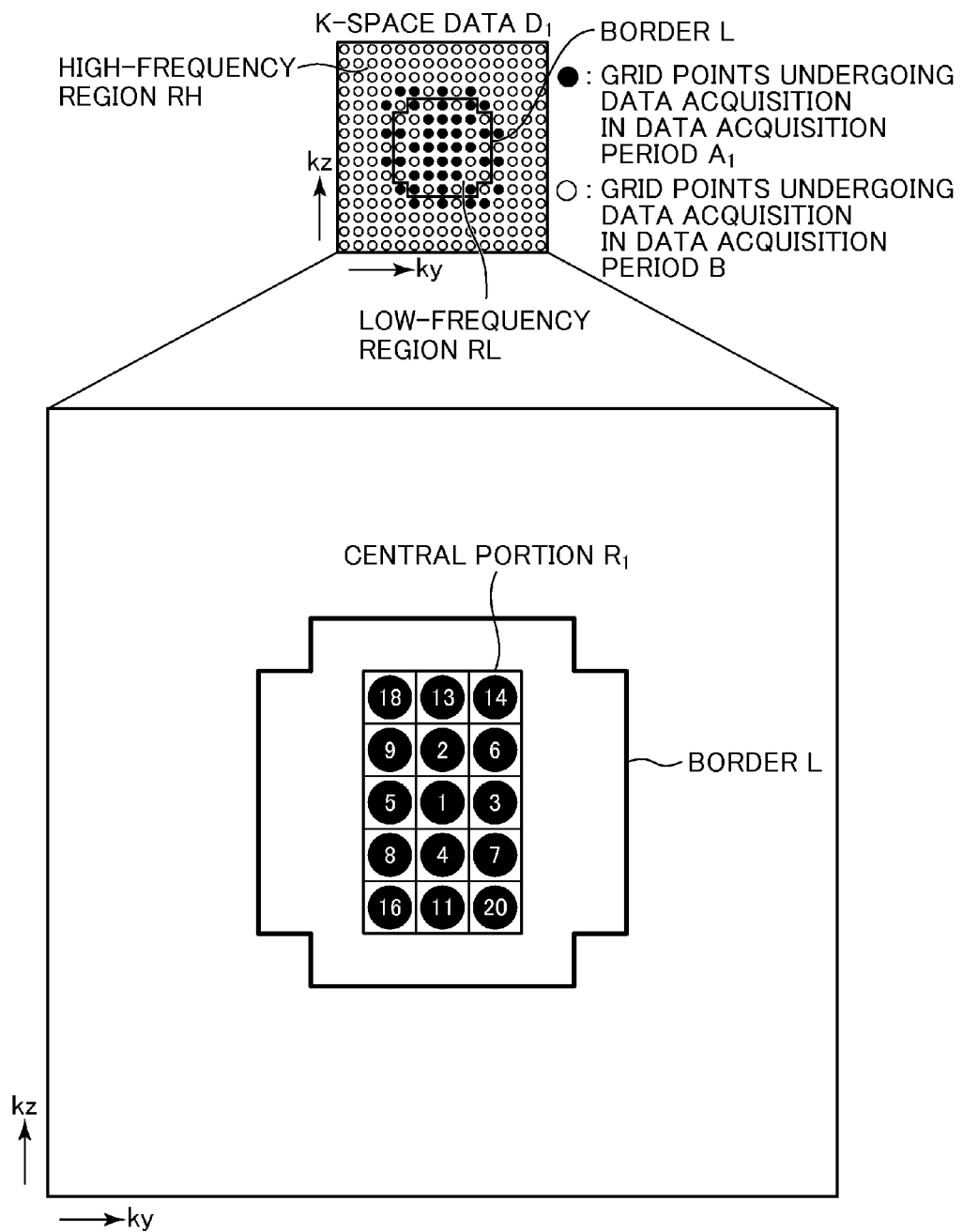
FIG. 17 is a diagram showing a central portion R1 of the k-space data D1.
Figure 18:
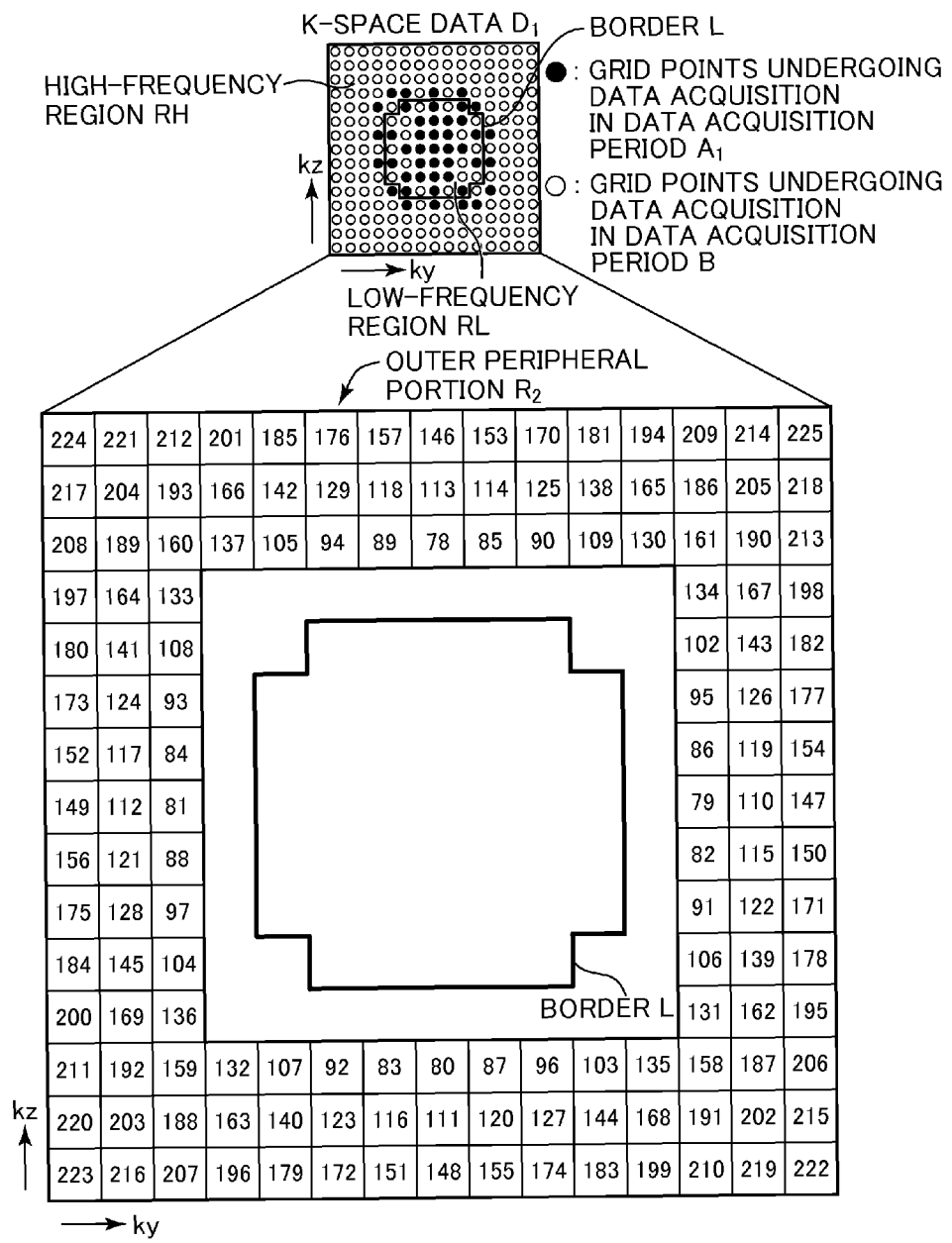
FIG. 18 is a diagram showing an outer peripheral portion R2 of the k-space data D1.
Figure 19:
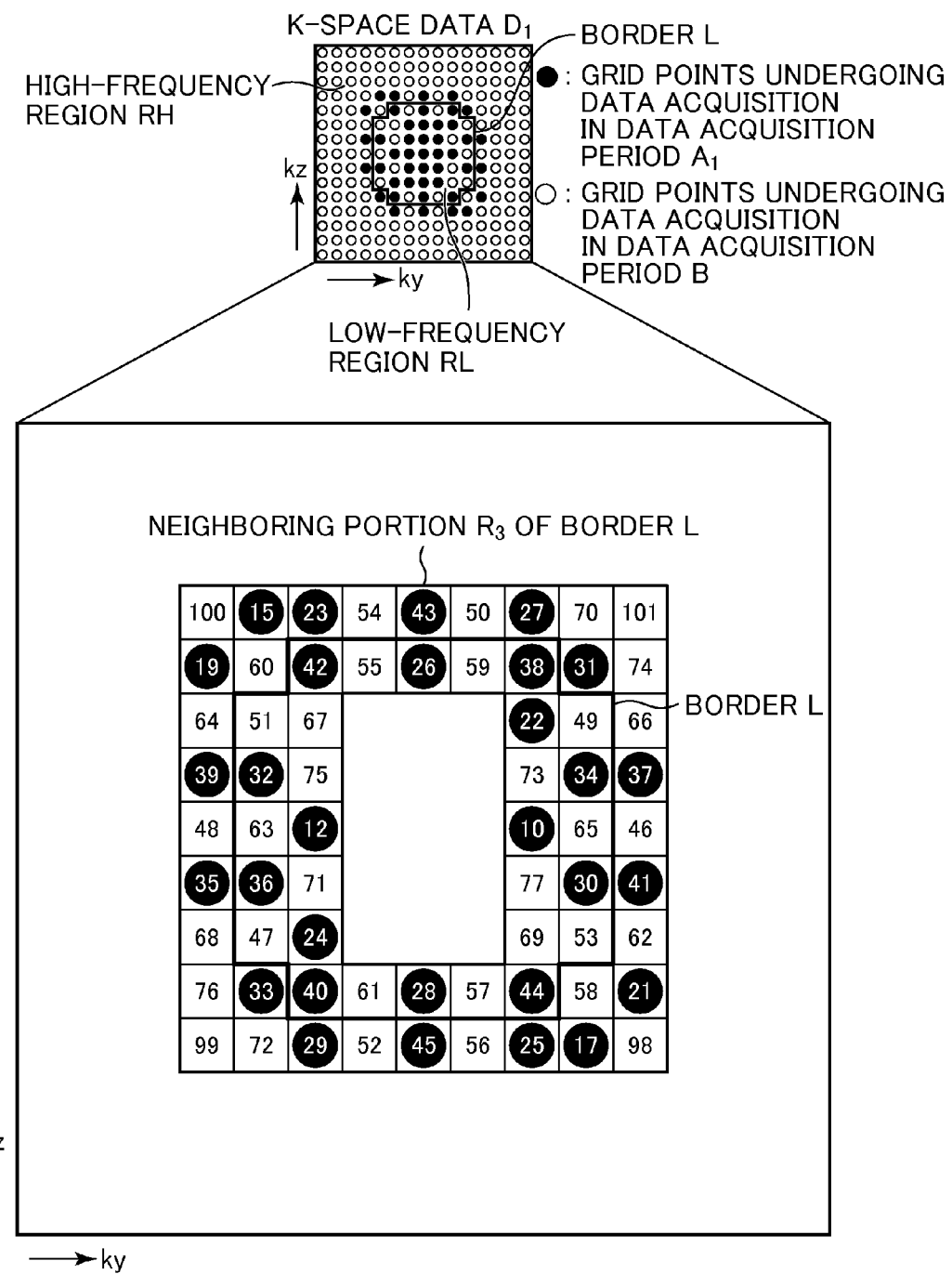
FIG. 19 is a diagram showing a neighboring portion R3 of the border L.

FIGS. 17-19 are diagrams showing k-space data D1 separately for three portions. FIG. 17 is a diagram showing a central portion R1 of the k-space data D1, FIG. 18 is a diagram showing an outer peripheral portion R2 of the k-space data D1, and FIG. 19 is a diagram showing a neighboring portion R3 of the border L. Now FIGS. 17-19 will be described hereinbelow.

In the central portion R1 of the k-space data D1 (see FIG. 17), only data acquired in the data acquisition period A1 are placed, and in the outer peripheral portion R2 of the k-space data D1 (see FIG. 18), only data acquired in the data acquisition period B are placed.

In the neighboring portion R3 of the border L (see FIG. 19), however, both the data acquired in the data acquisition period A1 and data acquired in the data acquisition period B are placed. For example, data at grid points (for example, grid points 32, 36) acquired in the data acquisition period A1 and data at grid points (for example, grid points 51, 63) acquired in the data acquisition period B are placed inside of the border L (on the low-frequency region RL side). Similarly, data at grid points (for example, grid points 35, 39) acquired in the data acquisition period A1 and data at grid points (for example, grid points 48, 64) acquired in the data acquisition period B are placed outside of the border L (on the high-frequency region RH side). Therefore, it can be seen that the data at grid points acquired in the data acquisition period A1 and those acquired in the data acquisition period A1 are dispersedly placed in ky and kz directions in the neighboring portion R3 of the border L. Referring again to FIG. 15, the description will be continued hereinbelow. The image producing unit 94 (see FIG. 2) applies Fourier transform to the k-space data D1. An image $IM_1$ can thus be produced.

After the data DB are acquired in the data acquisition period B, data are further acquired in the data acquisition periods A2 and A3.

In the data acquisition period A2, again, a fat suppression pulse F is applied. Immediately after the fat suppression pulse F is applied, a sequence V is performed. In the data acquisition period A2, data DA2 at grid points 1-45 are acquired in the order of the numbers assigned to the grid points. Thus, by the data DB obtained in the data acquisition period B and the data DA2 obtained in the data acquisition period A2, a second set of k-space data D2 including the data at grid points 1-225 can be obtained.

After the k-space data D2 have been obtained, the image producing unit 94 applies Fourier transform to the k-space data D2. An image $IM_2$ can thus be produced. After acquiring the data DA2 in the data acquisition period A2, the process moves on to the data acquisition period A3.

In the data acquisition period A3, again, a fat suppression pulse F is applied. Immediately after the fat suppression pulse F is applied, a sequence V is performed. In the data acquisition period A3, data DA3 at grid points 1-45 are acquired in the order of the numbers assigned to the grid points. Thus, by the data DB obtained in the data acquisition period B and the data DA3 obtained in the data acquisition period A3, a third set of k-space data D3 including the data at grid points 1-225 can be obtained.

After the k-space data D3 have been obtained, the image producing unit 94 applies Fourier transform to the k-space data D3. An image $IM_3$ can thus be produced. The scan SC is thus conducted, and the flow in FIG. 7 is terminated.

According to the first embodiment, numbers for part of grid points lying in the low-frequency region are exchanged with those for part of grid points lying in the high-frequency region at Step ST13. Therefore, as shown in FIG. 14, part of grid points 1-45 (for example, grid points 35, 39) lie on the high-frequency region RH side across the border L. Similarly, part of grid points 46-225 (for example, grid points 51, 63) lie on the low-frequency region RL side across the border L. Then, at Step ST2, data at grid points 1-45 are acquired in the data acquisition period A1 (A2 and A3), and data at grid points 46-225 are acquired in the data acquisition period B. Therefore, the data at grid points acquired in the data acquisition period A1 (A2 and A3) and those acquired in the data acquisition period B are dispersedly placed in ky and kz directions in the neighboring portion R3 of the border L (see FIG. 19). Since data with high signal intensity and data with low signal intensity are thus dispersedly placed in the neighboring portion R3 of the border L, artifacts caused by differences in signal intensity (for example, ghosts) can be reduced.

In the first embodiment, a single fat suppression pulse F is applied in the data acquisition periods A1, B, A2, and A3 (see FIG. 15). However, the data acquisition period B has a greater number of data to be acquired than the data acquisition periods A1, A2, and A3. Therefore, in the data acquisition period B, the fat suppression effect of the fat suppression pulse F diminishes as the end of the data acquisition period B is approached, and a fat suppression effect equivalent to that in the data acquisition periods A1, A2, and A3 possibly cannot be achieved. Thus, in view of the greater number of data to be acquired in the data acquisition period B than that in the data acquisition periods A1, A2, and A3, it is desirable to apply a plurality of fat suppression pulses (see FIG. 20).

Figure 20:
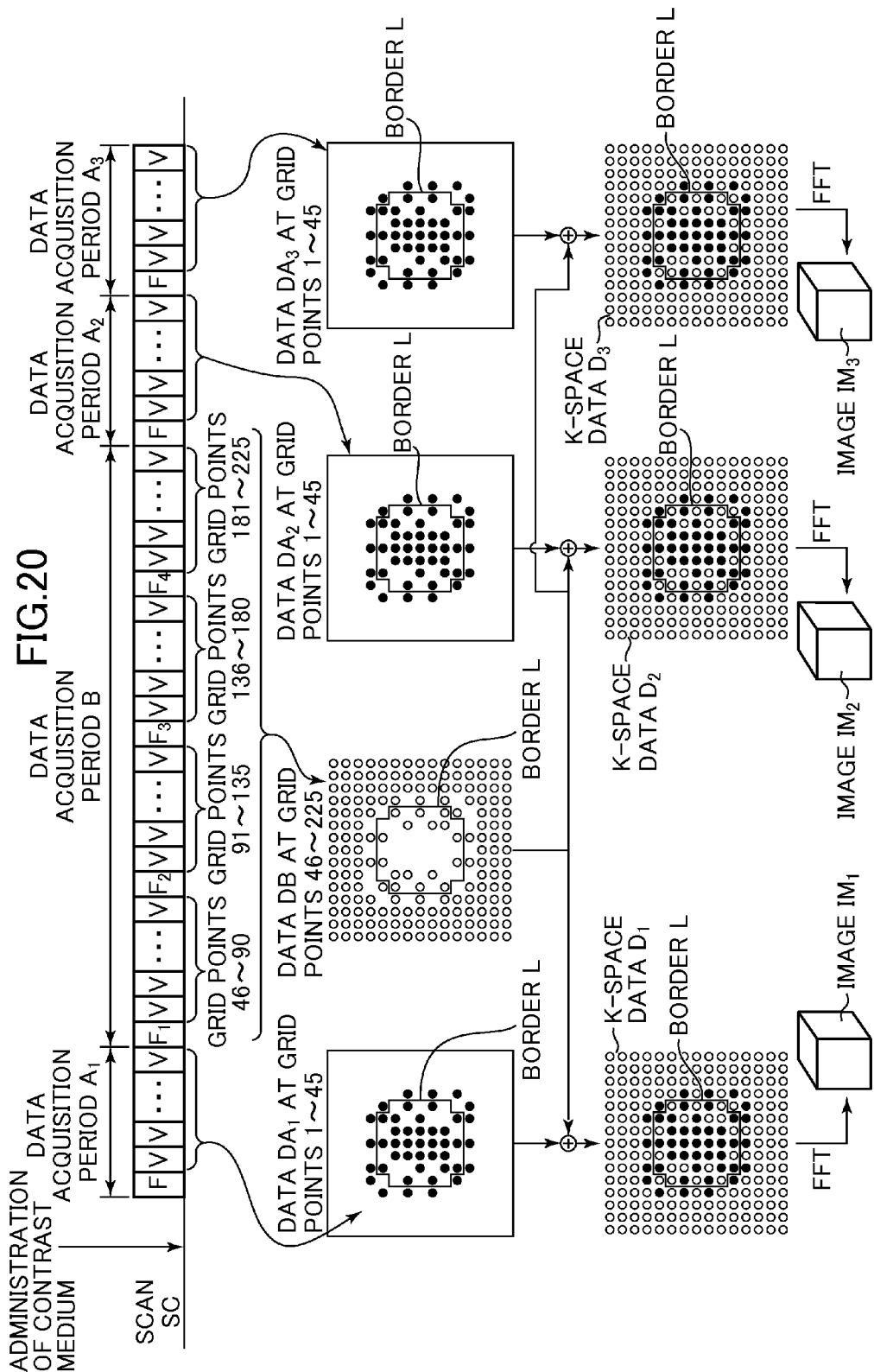
FIG. 20 is a diagram showing a case in which a plurality of fat suppression pulses are applied in the data acquisition period B.

FIG. 20 is a diagram showing a case in which a plurality of fat suppression pulses are applied in the data acquisition period B. FIG. 20 shows a case in which four fat suppression pulses F1-F4 are applied in the data acquisition period B. Data at grid points 46-90 are acquired between the fat suppression pulses F1 and F2. Data at grid points 91-135 are acquired between the fat suppression pulses F2 and F3. Data at grid points 136-180 are acquired between the fat suppression pulses F3 and F4. Data at grid points 181-225 are acquired after the fat suppression pulse F4.

In the data acquisition period B, a cycle in which data at 45 grid points are acquired after a fat suppression pulse is applied is repeated four times. Therefore, a fat suppression effect similar to that in the data acquisition periods A1, A2, and A3 may be achieved in the data acquisition period B.

In the first embodiment, the coefficients $\alpha$ and $\beta$ in EQS. (1) and (2) are defined as $\alpha=\beta=2$. Therefore, the number for grid point Np is chosen to be decremented by two and the number for grid point Nq is chosen to be incremented by two. However, the coefficients are not limited to $\alpha=\beta=2$ and may be defined as a different value. For example, in case that the coefficients are defined as $\alpha=\beta=3$, the number for grid point Np is chosen to be decremented by three and the number for grid point Nq is chosen to be incremented by three, thus resulting in greater spacing between grid points to be exchanged. Moreover, $\alpha$ and $\beta$ are not necessarily defined as the same value, and they may have different values. Further, $\alpha$ and $\beta$ may be changed according to a distance between a grid point and the border. For example, an exchange is made between the numbers for grid points Np and Nq using $\alpha=\beta=2$ while the distance from grid points Np and Nq to the border L is small, and as the distance from grid points Np and Nq to the border L increases, $\alpha$ and $\beta$ may be changed to $\alpha=\beta=3$ to conduct an exchange of the numbers for the grid points. By changing $\alpha$ and $\beta$ according to the distance between a grid point and the border, an exchange of numbers suitable for the order of acquisition of data at grid points can be achieved.

In the first embodiment, the data at grid points 45-255 are acquired in a single data acquisition period B. However, the data acquisition period B may be divided into a plurality of data acquisition periods, and the data at grid points 45-225 may be acquired separately in the plurality of data acquisition periods. Now an example in which the data at grid points 45-225 are acquired separately in a plurality of data acquisition periods will be described hereinbelow.

Figure 21:
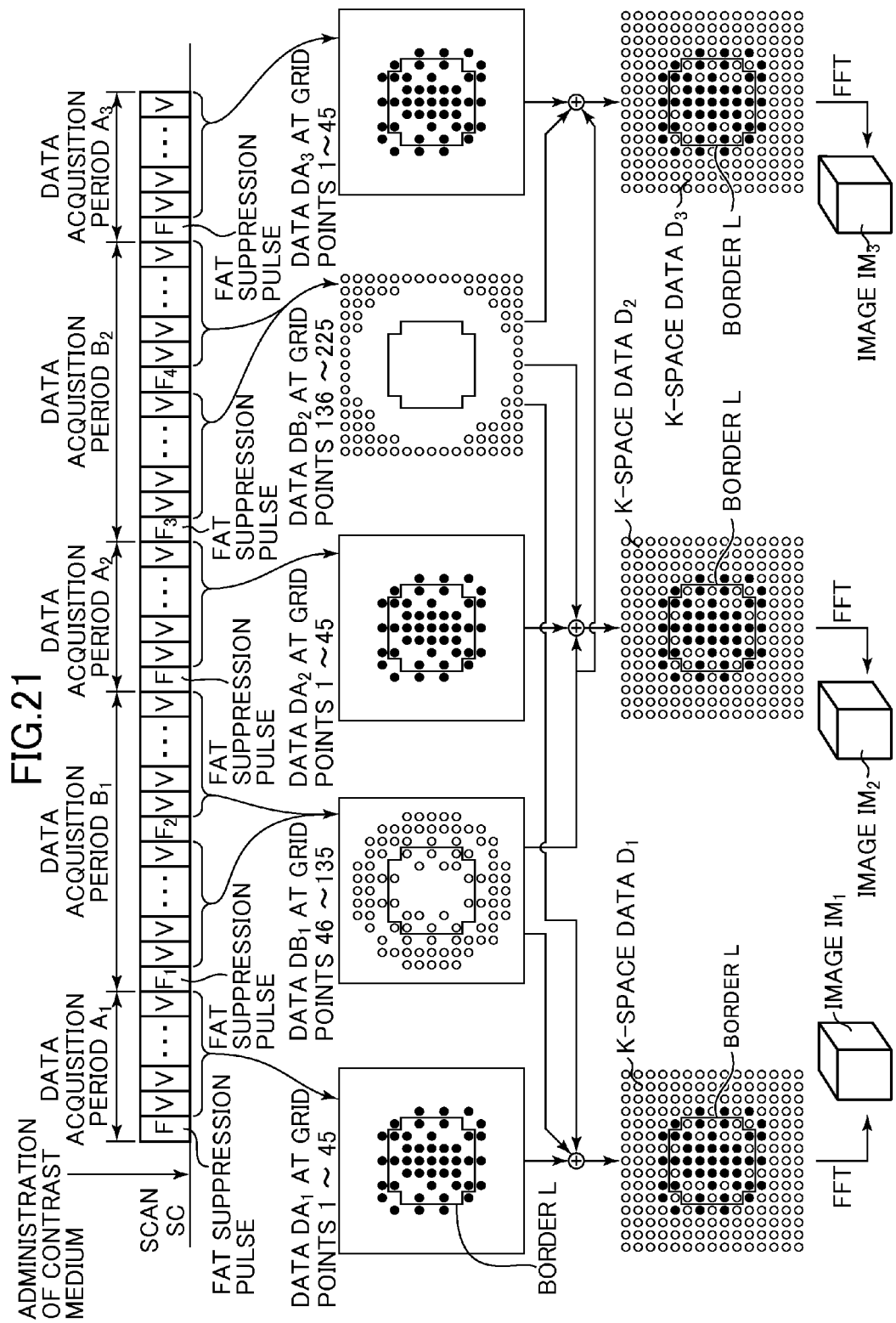
FIG. 21 is an explanatory diagram of an example in which data at grid points 45-225 are acquired separately in a plurality of data acquisition periods.

FIG. 21 is an explanatory diagram of an example in which the data at grid points 45-225 are acquired separately in a plurality of data acquisition periods. FIG. 21 shows a case in which the data acquisition period B is divided into two data acquisition periods B1 and B2.

The data acquisition periods A1, A2, and A3 are each a period of time for acquiring data at grid points 1-45. On the other hand, the data acquisition periods B1 and B2 are provided for acquiring data at grid points 45-225 in a divided manner. In particular, the data acquisition period B1 is a period of time for acquiring data at grid points 46-135, and the data acquisition period B2 is a period of time for acquiring data at grid points 136-225.

In FIG. 21, a first set of k-space data D1 are obtained by data DA1 acquired in the data acquisition period A1, data DB1 acquired in the data acquisition period B1, and data DB2 acquired in the data acquisition period B2. By applying Fourier transform to the k-space data D1, an image $IM_1$ can be produced.

A second set of k-space data D2 are obtained by the data DB1 acquired in the data acquisition period B1, data DA2 acquired in the data acquisition period A2, and the data DB2 acquired in the data acquisition period B2. By applying Fourier transform to the k-space data D2, an image $IM_2$ can be produced.

Then, a third set of k-space data D3 are obtained by the data DB1 acquired in the data acquisition period B1, the data DB2 acquired in the data acquisition period B2, and data DA3 acquired in the data acquisition period A3. By applying Fourier transform to the k-space data D3, an image $IM_3$ can be produced.

In FIG. 21, data at grid points 46-135 are acquired in the data acquisition period B1 and data at grid points 136-225 are acquired in the data acquisition period B2. However, a method of acquiring data at grid points 46-225 separately in the data acquisition periods B1 and B2 is not limited to that shown in FIG. 21. For example, it may be contemplated that data at odd-numbered ones of grid points 46-225 are acquired in the data acquisition period B1 and data at even-numbered ones of grid points 46-225 are acquired in the data acquisition period B2.

As compared with the MR apparatus in the first embodiment, an MR apparatus in a second embodiment is different therefrom in processing the processor 9 executes; except that, it is similar to the MR apparatus in the first embodiment. Accordingly, the processor 9 will be mainly described for the MR apparatus in the second embodiment.

Figure 22:
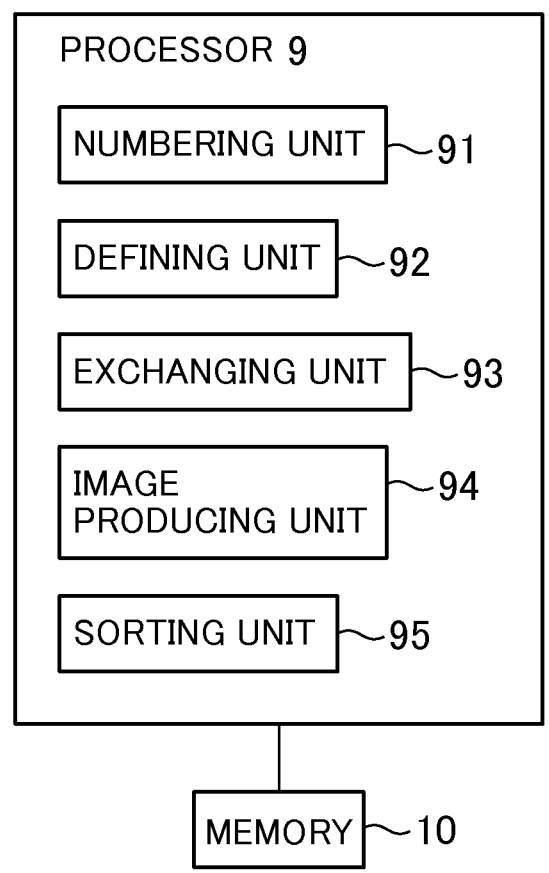
FIG. 22 is an explanatory diagram of processing executed by the processor in a second embodiment.

FIG. 22 is an explanatory diagram of processing the processor 9 executes in the second embodiment. In the memory 10, programs executed by the processor 9 are stored. The processor 9 loads thereon a program stored in the memory 10, and executes processing written in the program. The processor 9 constitutes numbering unit 91-sorting unit 95, etc. by loading thereon programs stored in the memory 10.

Since the numbering unit 91-image producing unit 94 are similar to those in the first embodiment, descriptions thereof will be omitted. The sorting unit 95 is configured to sort numbers for grid points after numbers for grid points are changed. In the second embodiment, the processor 9 is an example for constructing the numbering unit 91-sorting unit 95. It should be noted that the numbering unit 91, defining unit 92, exchanging unit 93, and sorting unit 95 together constitute the determining unit.

Now flow of dynamic MR imaging according to the second embodiment will be described with reference to FIG. 7.

Figure 23:
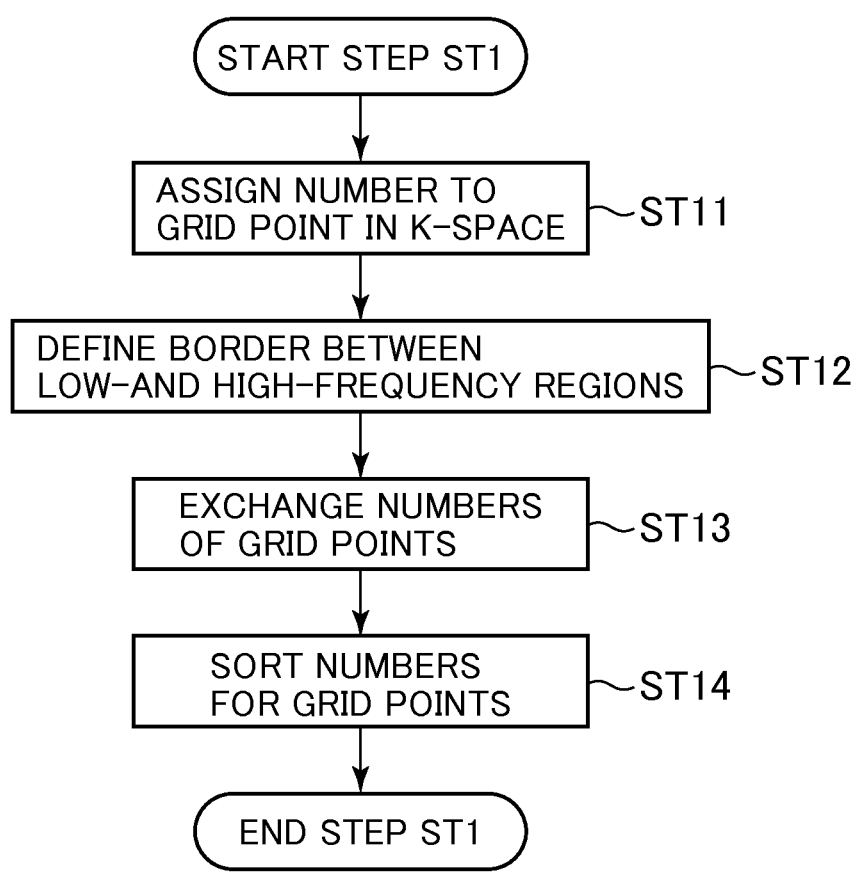
FIG. 23 is a diagram showing flow of Step ST1 in the second embodiment.

At Step ST1, an order of acquisition of data at grid points is determined (see FIG. 23). FIG. 23 is diagram showing flow of Step ST1 according to the second embodiment. Since Steps ST11-ST13 are similar to those in the first embodiment, descriptions thereof will be omitted. After numbers have been exchanged at Step ST13 (see FIG. 14), the process goes to Step ST14.

Figure 24:
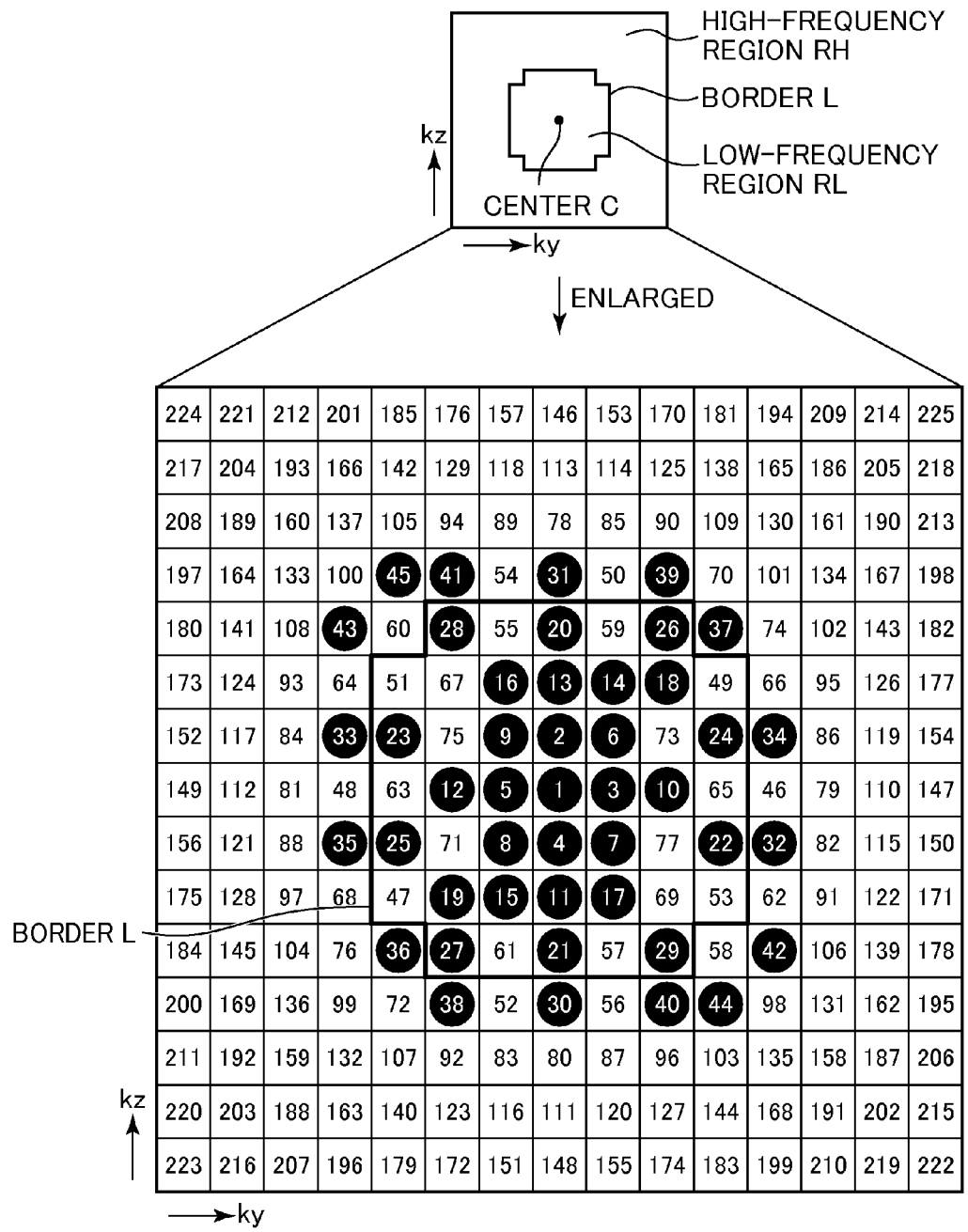
FIG. 24 is a diagram showing numbers for grid points 1-45 after sorting of the numbers by sorting unit 95 is completed.

At Step ST14, the sorting unit 95 (see FIG. 22) sorts numbers for grid points 1-45 shown in FIG. 14. In particular, it sorts numbers for grid points 1-45 shown in FIG. 14 so that a grid point has a greater number as it lies farther from the center of k-space (from grid point 1). FIG. 24 shows numbers for grid points 1-45 after the numbers have been sorted by the sorting unit 95.

According to the second embodiment, numbers "1"-"225" assigned to grid points in k-space after the numbers have been sorted (see FIG. 24) represent the order in which data at the grid points are to be acquired. In the second embodiment, similarly to the first embodiment, grid points 1-45 represent grid points undergoing data acquisition in the data acquisition periods A1, A2, and A3, while grid points 46-225 represent grid points undergoing data acquisition in the data acquisition period B.

Once the numbers have been sorted at Step ST14, Step ST1 is terminated. After Step ST1 has ended, the process goes to Step ST2 (see FIG. 7).

At Step ST2, a scan is conducted. In the data acquisition periods A1, A2, and A3 of the scan, data at grid points 1-45 are acquired in the order of the numbers assigned to the grid points shown in FIG. 24. On the other hand, in the data acquisition period B, data at grid points 46-225 are acquired in the order of the numbers assigned to the grid points shown in FIG. 24. Once the data have been acquired, the flow is terminated.

According to the second embodiment, numbers for grid points 1-45 are sorted by the sorting unit 95 in an ascending order of the distance from grid point 1. Therefore, in the data acquisition periods A1, A2, and A3, after a fat suppression pulse is applied, data at grid points closer to the center of k-space are acquired earlier, thus further enhancing the fat suppression effect of the fat suppression pulse. While FIG. 24 shows a case in which only the numbers for grid points 1-45 are sorted, the numbers for grid points 46-225 may be sorted so that a grid point has a greater number as it lies farther from the center of k-space (from grid point 1).

Figure 25:
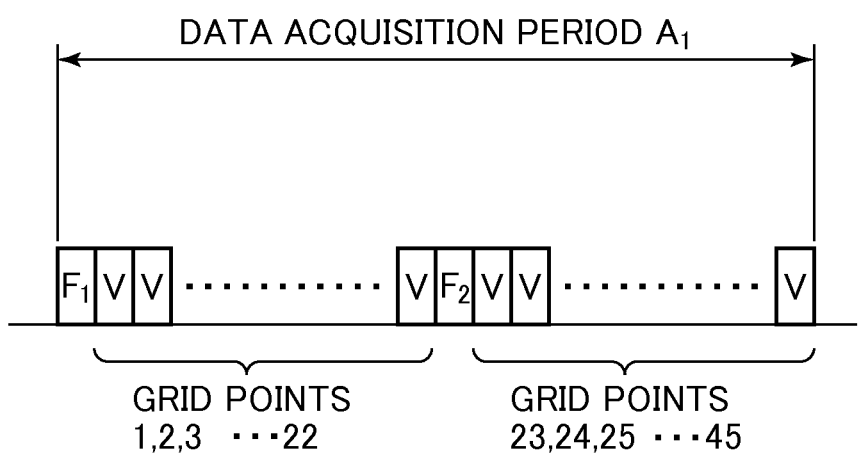
FIG. 25 is a diagram showing a case in which a plurality of fat suppression pulses are applied in the data acquisition period A1.

In the first and second embodiments, a single fat suppression pulse F is applied in each of the data acquisition periods A1, A2, and A3. However, a plurality of fat suppression pulses may be applied in the data acquisition periods A1, A2, and A3. FIG. 25 is a diagram showing a case in which a plurality of fat suppression pulses are applied in the data acquisition period A1.

FIG. 25 shows a case in which two fat suppression pulses F1 and F2 are applied in the data acquisition period A1. Data at grid points 1-22 are acquired between the fat suppression pulses F1 and F2, and data at grid points 23-45 are acquired after the fat suppression pulse F2.

Figure 26:
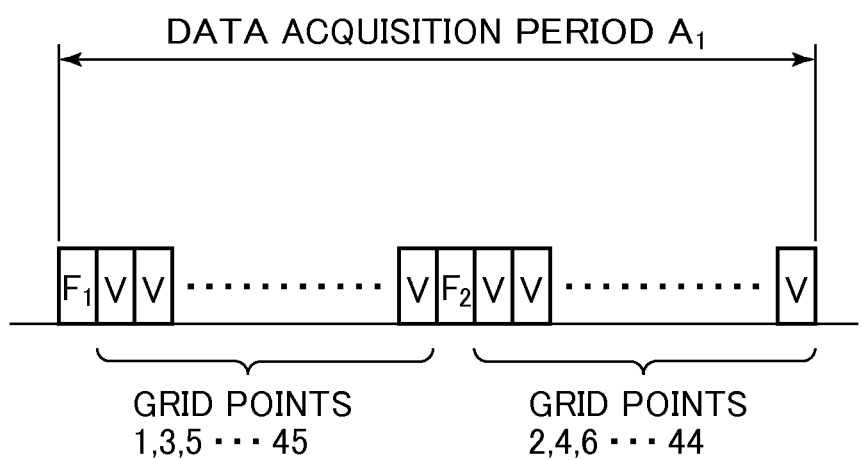
FIG. 26 is a diagram showing an example in which data at grid points 1-45 are acquired separately for odd- and even-numbered grid points.

In FIG. 25, a second fat suppression pulse F2 is applied after the fat suppression pulse F1. Therefore, even in case that the fat suppression effect of the fat suppression pulse F1 diminishes in the middle of the data acquisition period A1, a sufficient fat suppression effect can be kept by the second fat suppression pulse F2 until the data acquisition period A1 ends. Moreover, it may be contemplated that data at odd-numbered ones of grid points 1-45 are acquired earlier in the first half of the data acquisition period A1, and data at even-numbered ones of grid points 1-45 are acquired later in the second half of the data acquisition period A1, as shown in FIG. 26.

In the first and second embodiments, the border L between the low- and high-frequency regions is defined at Step ST12, and an exchange of numbers is conducted in the vicinity of the border L. However, the present invention is not limited to the case in which the border L between the low- and high-frequency regions is defined, and it may be contemplated that a border different from the border L is defined, and an exchange of numbers is conducted in the vicinity of the different border. Further, grid points 1-225 shown in FIG. 14 may be arranged based on the distance from grid point 1 without defining the border L.

The first and second embodiments address a contrast-enhanced scan using a fat suppression pulse. However, even in a contrast-enhanced scan using no fat suppression pulse, signal intensity of MR signals acquired from a region to be imaged varies depending upon the amount of a contrast medium entering the region to be imaged, thus artifacts due to differences in signal intensity may appear. Therefore, the present invention may be applied to a case in which a contrast-enhanced scan using no fat suppression pulse is conducted.

Moreover, while the first and second embodiments describe a scan using a contrast medium, the present invention may be applied regardless of whether a contrast medium is used or not insofar as the scan suffers from artifacts due to differences in signal intensity. Further, the present invention may be applied to scans other than those described above insofar as the scan suffers from artifacts due to differences in signal intensity. Examples of such scans may include, for example, a scan using a navigator sequence for acquiring navigator echoes containing information on subject's respiration, and a scan using a blood flow suppression sequence (for example, MSDE [Motion Sensitized Driven Equilibrium] sequence) for suppressing blood flow signals.

The first and second embodiments address a case in which a 3D gradient echo-based sequence is used as the sequence V. However, the present invention is not limited to use of the 3D gradient echo-based sequence, and a 3D spin echo-based sequence may be used instead of the 3D gradient echo-based sequence. Moreover, a 2D sequence for acquiring data in each slice plane may be used instead of the 3D sequence.

In the first and second embodiments, data lying at one grid point is acquired by a single sequence V. However, an EPI (Echo Planar Imaging) technique or the like may be used to acquire data at a plurality of grid points by a single sequence V. Moreover, the present invention may be applied to a case in which data acquisition is conducted by a parallel imaging technique for high-speed imaging by reducing the number of phase encoding steps.

The invention claim is:

1. A magnetic resonance apparatus comprising a scanning section configured to conduct a scan for acquiring data at grid points contained in a first region in k-space and acquiring data at grid points contained in a second region adjacent to said first region, wherein said scanning section acquires:

in a first data acquisition period in which acquisition of data at grid points in k-space is conducted, data at part of a first plurality of grid points lying closer to said second region within said first region, and data at part of a second plurality of grid points lying closer to said first region within said second region; and in a second data acquisition period in which acquisition of data at grid points in k-space is conducted, data at grid points of said first plurality of grid points other than those at which data are acquired in said first data acquisition period, and data at grid points of said second plurality of grid points other than those at which data are acquired in said first data acquisition period;

said magnetic resonance apparatus further comprising a determining unit configured to determine grid points for which data are to be acquired in said first data acquisition period and grid points for which data are to be acquired in said second data acquisition period;

wherein said determining unit comprises a numbering unit configured to assign numbers to grid points in k-space; a defining unit configured to define a border between said first and second regions; and an exchanging unit configured to exchange numbers assigned to part of said first plurality of grid points with those assigned to part of said second plurality of grid points; and wherein said scanning section acquires in said first data acquisition period, data at grid points whose numbers are not exchanged by said exchanging unit within said first region, and data at grid points whose numbers are exchanged by said exchanging unit within said second region, and in said second data acquisition period, data at grid points whose numbers are exchanged by said exchanging unit within said first region, and data at grid points whose numbers are not exchanged by said exchanging unit within said second region.

2. The magnetic resonance apparatus as recited in claim 1, wherein said determining unit comprises a sorting unit configured to sort numbers for a third plurality of grid points, said third plurality of grid points including grid points whose numbers are not exchanged within said first region and grid points whose numbers are exchanged within said second region.

3. The magnetic resonance apparatus as recited in claim 2, wherein said scanning section acquires, in said first data acquisition period, data at each of said third plurality of grid points according to numbers for said third plurality of grid points after being sorted by said sorting unit.

4. The magnetic resonance apparatus as recited in claim 2, wherein said sorting unit sorts numbers for said third plurality of grid points so that a grid point has a greater number as it lies farther from a center of k-space.

5. The magnetic resonance apparatus as recited in claim 1, wherein said exchanging unit exchanges a number for each grid point chosen from within said first region so that the number for the grid point is decremented by $\alpha$, with a number for each grid point chosen from within said second region so that the number for the grid point is incremented by $\beta$.

6. The magnetic resonance apparatus as recited in claim 5, wherein said exchanging unit changes a value of $\alpha$ according to a distance between each grid point in said first region and said border, and a value of $\beta$ according to a distance between each grid point in said second region and said border.

7. The magnetic resonance apparatus as recited in claim 6, wherein the value of $\alpha$ is equal to the value of $\beta$.

8. The magnetic resonance apparatus as recited in claim 1, wherein said numbering unit assigns a number to a grid point in k-space based on a distance between the grid point and the center of k-space.

9. The magnetic resonance apparatus as recited in claim 1, wherein said scan has another first data acquisition period for acquiring data at the same grid points as those in said first data acquisition period.

10. The magnetic resonance apparatus as recited in claim 1, wherein said second data acquisition period is divided into a plurality of data acquisition periods, and said scanning section acquires data at mutually different grid points in said plurality of data acquisition periods.

11. The magnetic resonance apparatus as recited in claim 1, wherein said first region is a low-frequency region including the center of k-space, and said second region is a high-frequency region.

12. The magnetic resonance apparatus as recited in claim 1, wherein said scanning section performs in said first data acquisition period, a first sequence for acquiring data at part of said first plurality of grid points and data at part of said second plurality of grid points, and in said second data acquisition period, a second sequence for acquiring data at grid points of said first plurality of grid points other than those at which data are acquired in said first data acquisition period, and data at grid points of said second plurality of grid points other than those at which data are acquired in said first data acquisition period.

13. The magnetic resonance apparatus as recited in claim 12, wherein said scanning section performs in said first data acquisition period, said first sequence after applying a fat suppression pulse, and in said second data acquisition period, said second sequence after applying a fat suppression pulse.

14. The magnetic resonance apparatus as recited in claim 13, wherein a plurality of fat suppression pulses are applied in said first or second data acquisition period.

15. The magnetic resonance apparatus as recited in claim 12, wherein said scanning section performs in said first data acquisition period, a first navigator sequence for acquiring navigator echoes containing information on subject's respiration, and said first sequence after performing said first navigator sequence, and in said second data acquisition period, a second navigator sequence for acquiring navigator echoes containing information on subject's respiration, and said second sequence after performing said second navigator sequence.

16. The magnetic resonance apparatus as recited in claim 12, wherein said scanning section performs in said first data acquisition period, a first blood flow suppressing sequence for reducing blood flow signals, and said first sequence after performing said first blood flow suppressing sequence, and in said second data acquisition period, a second blood flow suppressing sequence for reducing blood flow signals, and said second sequence after performing said second blood flow suppressing sequence.

17. The magnetic resonance apparatus as recited in claim 1, wherein said scanning section conducts a scan on a subject to which a contrast medium is administered.

18. The magnetic resonance apparatus as recited in claim 1, further comprising an image producing unit for producing an image based on the data at grid points in k-space acquired in said first data acquisition period and the data acquired in said second data acquisition period.

* * * * *